United States Patent
Yamazaki et al.

(10) Patent No.: US 6,930,047 B2
(45) Date of Patent: Aug. 16, 2005

(54) DRY ETCHING APPARATUS, ETCHING METHOD, AND METHOD OF FORMING A WIRING

(75) Inventors: Shunpei Yamazaki, Tokyo (JP); Hideomi Suzawa, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 09/966,689

(22) Filed: Sep. 27, 2001

(65) Prior Publication Data

US 2002/0125213 A1 Sep. 12, 2002

(30) Foreign Application Priority Data

Oct. 4, 2000 (JP) ........................................ 2000-305564
Sep. 21, 2001 (JP) ........................................ 2001-289534

(51) Int. Cl.[7] .......................................... H01L 21/302
(52) U.S. Cl. ...................................... 438/706; 710/714
(58) Field of Search ............................... 438/706, 710, 438/714, 720, 728; 216/71, 67; 156/345

(56) References Cited

U.S. PATENT DOCUMENTS

| 4,233,109 | A | * | 11/1980 | Nishizawa | 216/67 |
|---|---|---|---|---|---|
| 4,885,074 | A | * | 12/1989 | Susko et al. | 204/298.31 |
| 5,716,534 | A | * | 2/1998 | Tsuchiya et al. | 216/67 |
| 5,767,017 | A | * | 6/1998 | Armacost et al. | 438/694 |
| 5,824,606 | A | * | 10/1998 | Dible et al. | 438/729 |
| 5,883,007 | A | * | 3/1999 | Abraham et al. | 438/714 |
| 5,906,948 | A | * | 5/1999 | Liu et al. | 438/689 |
| 6,239,403 | B1 | * | 5/2001 | Dible et al. | 118/723 I |
| 6,259,106 | B1 | * | 7/2001 | Boegli et al. | 250/492.22 |
| 6,357,385 | B1 | | 3/2002 | Ohmi et al. | |
| 6,423,242 | B1 | * | 7/2002 | Kojima et al. | 216/71 |
| 6,431,112 | B1 | * | 8/2002 | Sill et al. | 118/723 E |
| 6,515,336 | B1 | | 2/2003 | Suzawa | |
| 6,534,826 | B2 | | 3/2003 | Yamazaki | |
| 6,556,702 | B1 | * | 4/2003 | Rishton et al. | 382/144 |
| 6,753,257 | B2 | | 6/2004 | Yamazaki | |

FOREIGN PATENT DOCUMENTS

JP  10-326772  12/1998

OTHER PUBLICATIONS

El–Kareh, Badih, "Fundamentals of Semiconductor Processing Technologies", 1998, Kluwer Academic Publishers, third printing, p. 285.*

* cited by examiner

Primary Examiner—Kin-Chan Chen
(74) Attorney, Agent, or Firm—Fish & Richardson P.C.

(57) ABSTRACT

An etching apparatus is provided, in which a plurality of electrodes are disposed for placing a substrate, high-frequency power sources as many as electrodes are provided, and the electrodes and the high-frequency power sources are connected to each other independently. Among a plurality of electrodes, a high-frequency power applied to an electrode disposed below the central portion of the substrate and a high-frequency power applied to electrodes disposed below corner portions of the substrate are controlled respectively, whereby in-plane uniformity of etching can be enhanced.

14 Claims, 20 Drawing Sheets

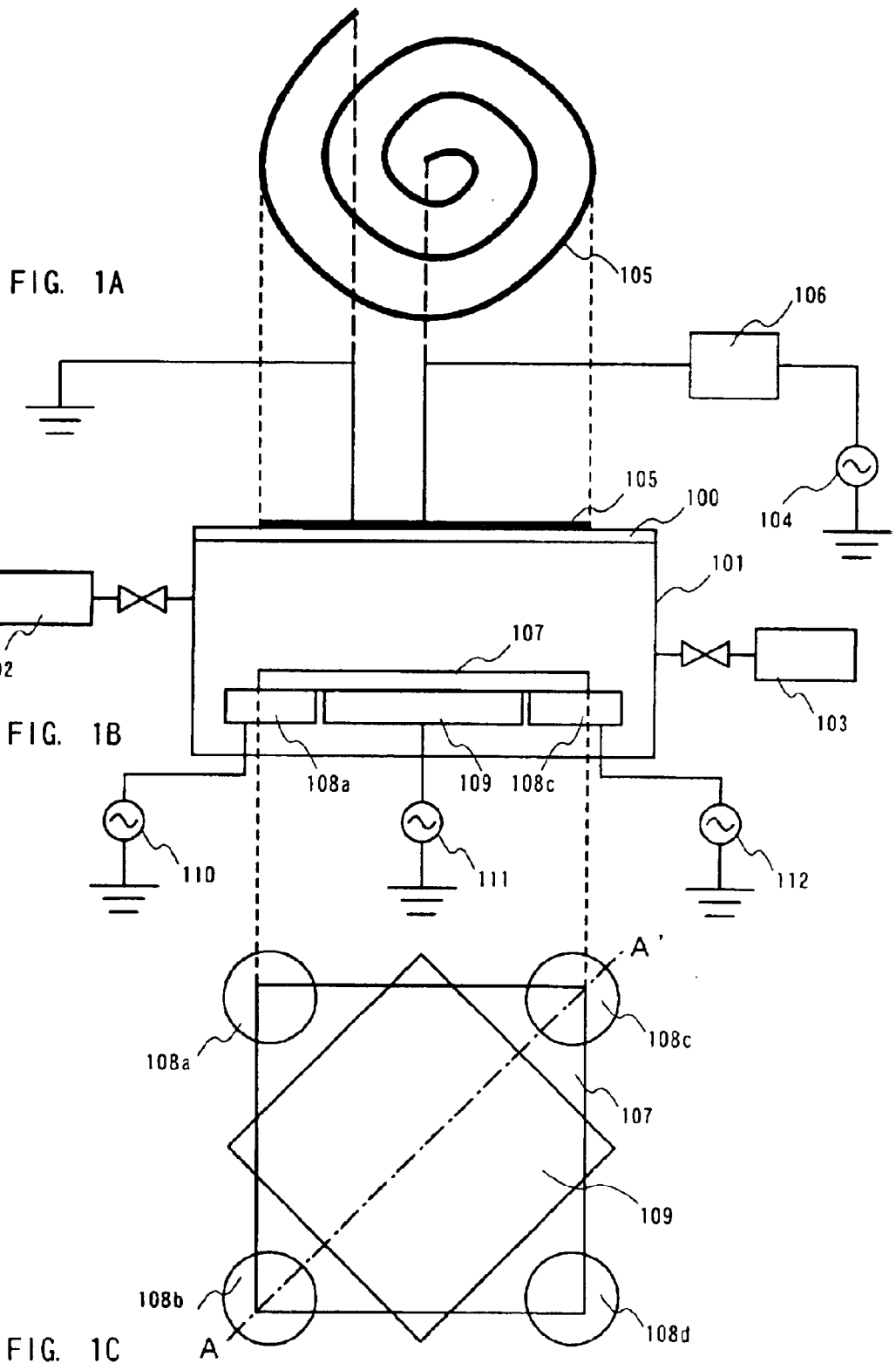

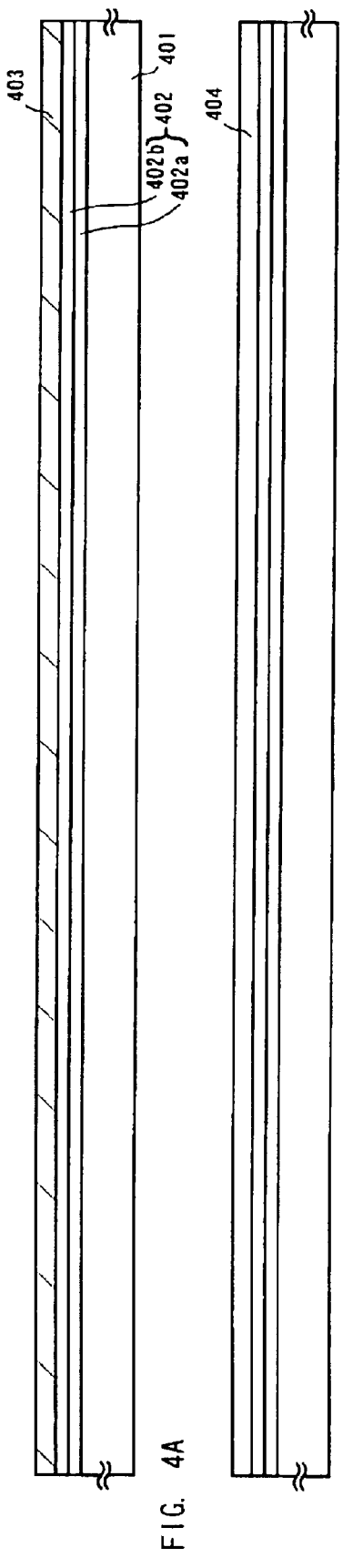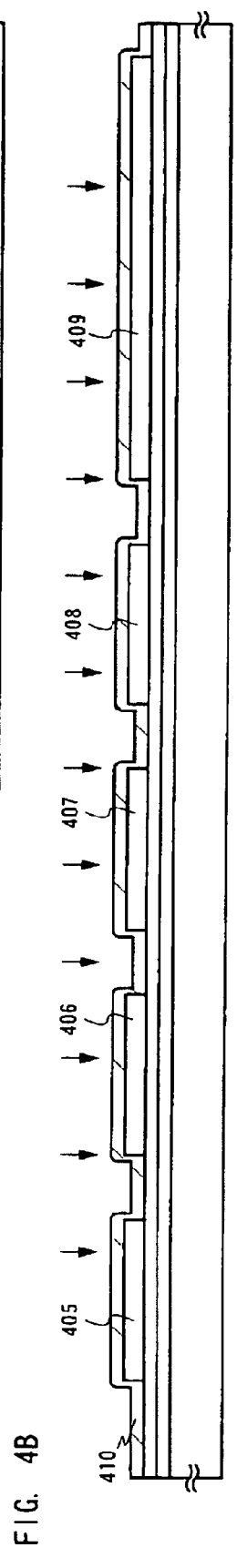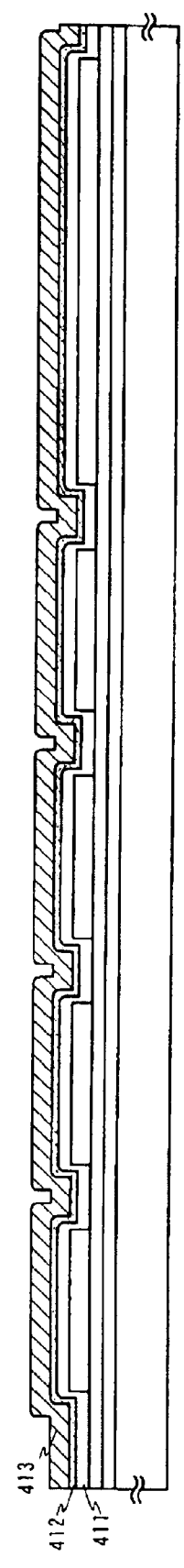

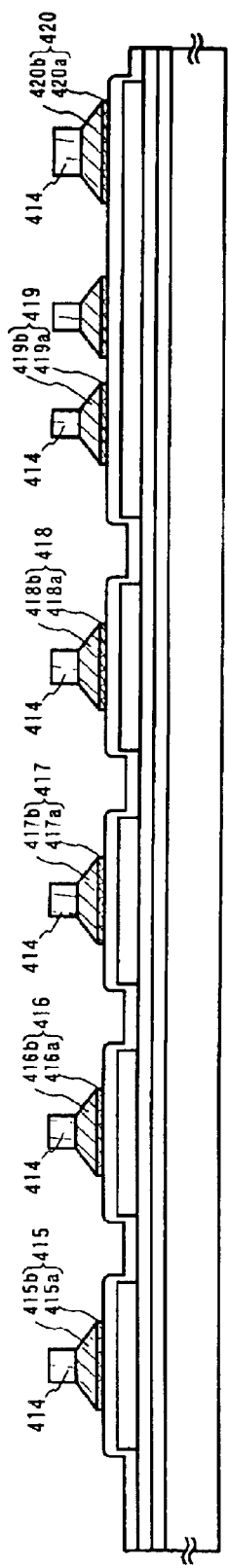
FIG. 5A
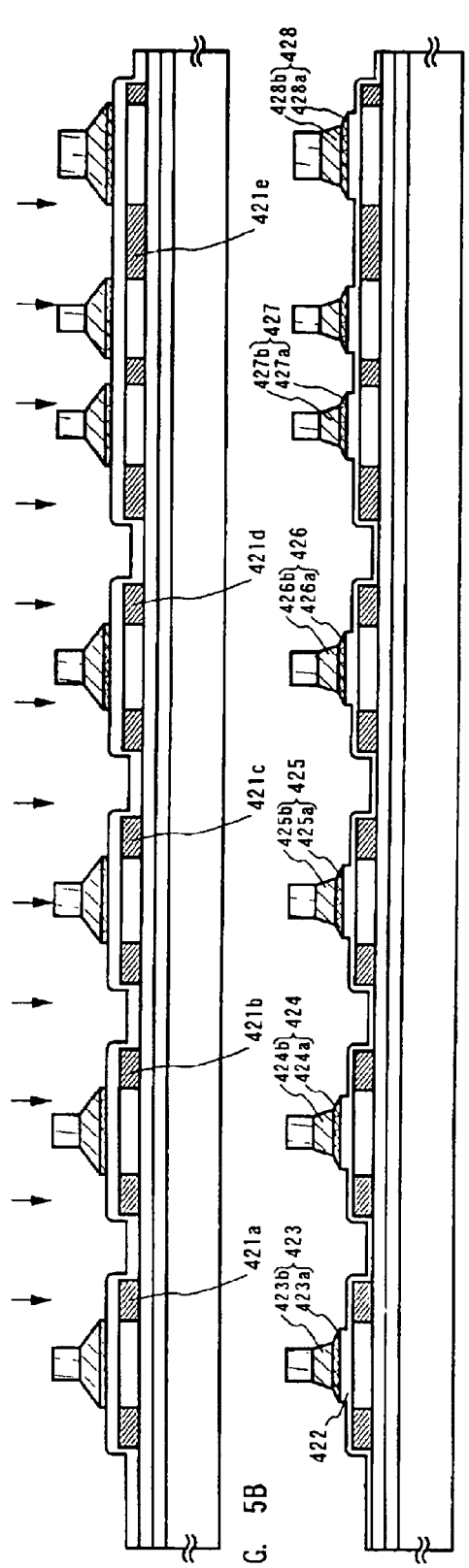
FIG. 5B
FIG. 5C
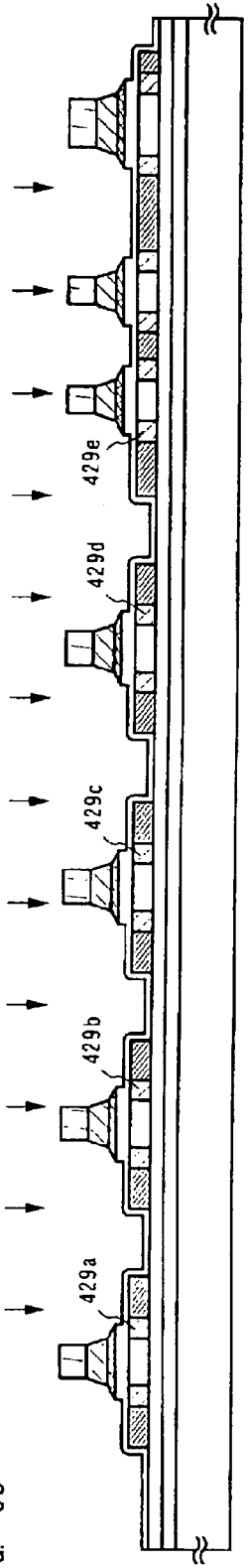
FIG. 5D pixel TFT portion      capacitor portion

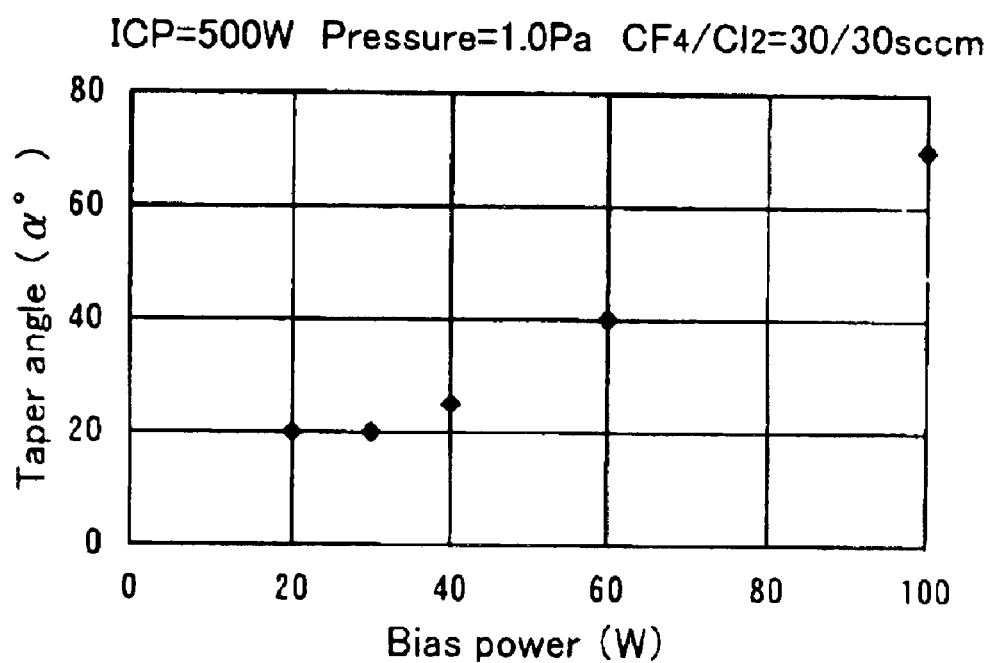
FIG. 11 Dependence of taper angle on bias power.

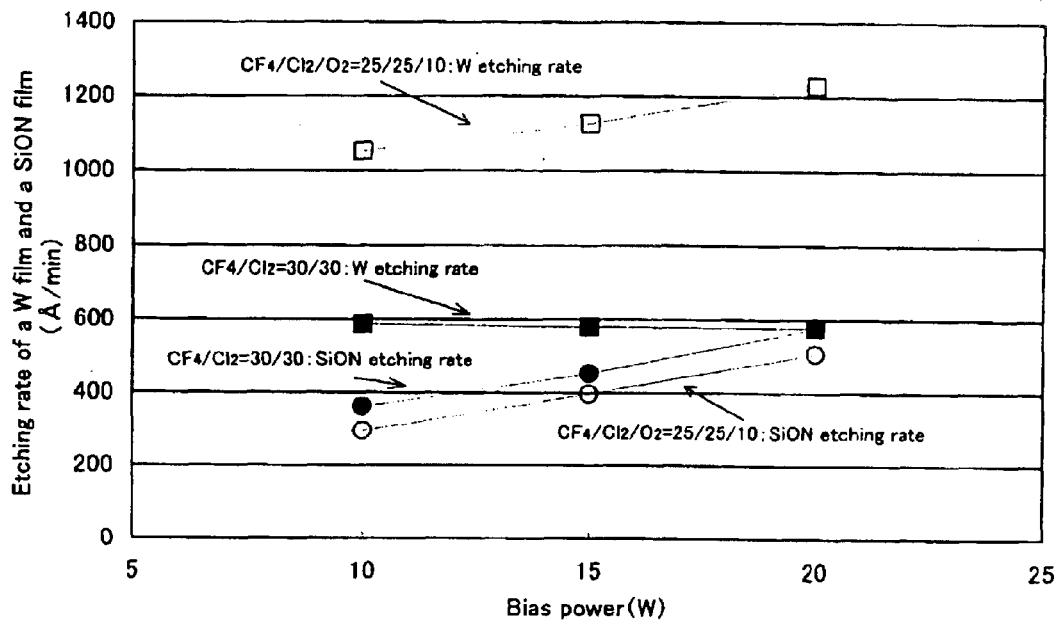
Fig. 12 Dependence of an etching rate of a W film and an SiON film on bias power.
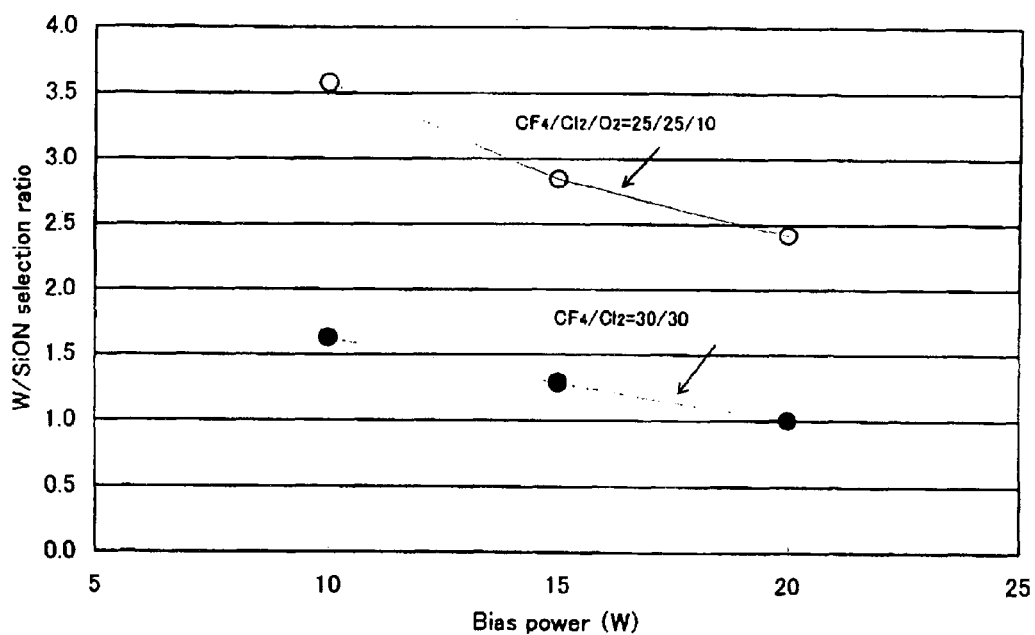
Fig. 13 Dependence of a selection ratio between a W film and an SiON film on a bias power.

DRY ETCHING APPARATUS, ETCHING METHOD, AND METHOD OF FORMING A WIRING

BACKGROUND OF THE INVENTION

1. Field of the Invention

The present invention relates to a dry etching apparatus. In particular, the present invention relates to an etching apparatus using plasma generated by applying a magnetic field or an electric field to a reaction gas introduced into a low-pressure chamber, and an etching method.

2. Description of the Related Art

Conventionally, there is a limit to a treatment ability of a dry etching apparatus, which causes problems in terms of enhancement of productivity.

In order to enhance a production efficiency, a mother glass size is increasing year after year. A currently used substrate has a size of 550 mm×650 mm, 650 mm×830 mm, etc. In the future, it is expected that a size of 850 mm×950 mm, a size of 950 mm×1000 mm, etc. will be used.

Conventionally, in-plane uniformity of etching tends to decrease with an increase in size of a substrate to be treated.

Japanese Patent Application Laid-open No. Hei 10-326772 discloses a technique of uniformly etching the entire surface of a substrate to be treated. Japanese Patent Application Laid-open No. Hei 10-326772 describes a parallel-plate type etching apparatus. In this apparatus, a lower electrode is separated into a ring shape, and the frequency of an AC electric field applied between the lower electrode and an upper electrode is varied. The separated lower electrode is connected to a low-frequency power source or a high-frequency power source.

The inventors of the present invention found that, when dry etching is conducted using a square or rectangular substrate, etching variations peculiar to the substrate are caused in a substrate surface.

Hereinafter, an etching method using a conventional parallel-plate type dry etching apparatus will be described.

Table 1 shows experimental results obtained by measuring variations in a substrate of etching using a parallel-plate type dry etching apparatus (electrode size: 50 cm×50 cm) by an RIE method.

TABLE 1

Selection ratio of $SiO_2$/a-Si at portions (A to I) in a substrate surface

|  | A | B | C | D | E | F | G | H | I |
|---|---|---|---|---|---|---|---|---|---|
| Sample 1 | 39 | 23.7 | 78 | 25.5 | 15.3 | 10.4 | 71.8 | 11.4 | 7.4 |
| Sample 2 | 30.4 | 13.9 | 19.8 | 82.7 | 22.3 | 7 | 9.9 | 73.4 | 10.7 |
| Sample 3 | 59 | 83.1 | 16.3 | 30.1 | 27.9 | 66 | 7.8 | 7.8 | 108 |
| Sample 4 | 45.1 | 23.9 | 30.1 | 16.9 | 106.9 | 10.5 | 7.4 | 11.8 | 11.4 |

Etching conditions: $CHF_3$=35 sccm, 800 W, 400 sec
Average value of a selection ratio: 34.1, Minimum value of a selection ratio: 7, Maximum value of a selection ratio: 107.6

Table 1 shows selection ratios between a silicon oxide film and an amorphous silicon film at portions (A to I) shown in FIG. 21A. Four samples were arranged on the electrode as shown in FIG. 21B, and the etching was conducted. Etching was conducted using $CHF_3$ as an etching gas with a flow rate of 35 sccm at 800 W (electric power density: 0.32 W/cm²) for 400 seconds, and the four samples were compared with respect to the portions.

As is understood from Table 1, the selection ratio at measurement point located in center portion of electrode is most uniform (30.4 to 59). On the other hand, the selection ratios of measurement points located in the corner portions of the electrode are very low as the measurement point exists away from the center portion of the electrode. That is, variations in the selection ratio of etching are caused in one substrate among four substrates shown in FIG. 21 B. For example, with respect to the substrate of sample 1, the selection ratio-of point I which is the most away from the center portion of the electrode is 7.4, the selection ratio of point G which is the nearest to the center portion of the electrode is 71.8. In the selection ratios of both points, about ten times difference is caused.

According to the experiment of the inventors of the present invention, the selection ratio of etching is largest at the center of a substrate, and decreases in a concentric manner as the measurement point exists away from the center portion of the electrode. In particular, the selection ratios at four corner portions (F to I) of the substrate are lowest. Thus, although the entire surface of a substrate should be etched with a uniform electric power density, variations in etching are caused. More specifically, in the case of using a rectangular substrate, a substantial electric power applied to the entire surface of a substrate becomes non-uniform, and an electric power density is varied between the central portion of the substrate and the corner portions thereof.

Therefore, in the case of using a conventional etching apparatus, the selection ratio at corner portions of an electrode becomes lowest, causing etching defects. The etching defects may decrease a yield. If a substrate is enlarged in the future, this problem is considered to become more conspicuous. The variations in etching are caused between the center portion of the substrate and the corner potion of the substrate when a big substrate with the same size as electrode is etched. The experiment results that four substrates are arranged on one electrode were shown here. Similar variations are also caused in case of a large substrate with the same size as electrode and in case of two substrates or more.

The problem involved in etching defects at corner portions of an electrode is not caused in the case where one circular substrate is used as in Japanese Patent Application Laid-open No. Hei 10-326772. That is, the problem that etching defects are caused in a rectangular substrate was found by the inventors of the present invention for the first time.

SUMMARY OF THE INVENTION

Therefore, with the foregoing in mind, it is an object of the present invention to provide a dry etching apparatus capable of treating a large substrate, and an etching method capable of enhancing in-plane uniformity of a rectangular substrate to be treated.

In order to solve the above-mentioned problem, according to the present invention, an etching apparatus is used, in which a plurality of electrodes are disposed for placing a substrate, high-frequency power sources as many as the electrodes are provided, and the electrodes and the high-frequency power sources are connected to each other independently. Among a plurality of electrodes, a high-frequency power applied to an electrode disposed below the central portion of the substrate and a high-frequency power applied to electrodes disposed below corner portions of the substrate are controlled respectively, whereby in-plane uniformity of etching is enhanced.

When controlling high-frequency powers applied to the plurality of electrodes, various parameters (bias power, ICP power, substrate temperature, etc.) in the high-frequency powers can be respectively regulated. However, it is preferable to regulate only one parameter. Typically, by regulating only a bias power (electric power density) of a high-frequency power per unit area applied to the plurality of electrodes, a taper angle obtained by etching processing, an etching rate of etching processing, and uniformity of a selection ratio can be enhanced. In an ICP etching apparatus provided with a coil electrode (area of a quartz plate: disk with a diameter of 25 cm) and an electrode (area: 12.5 cm×12.5 cm), etching processing can be controlled by varying a bias power as shown in FIGS. 11 to 13. FIG. 11 shows dependence of a taper angle on a bias power. FIG. 12 shows dependence of an etching rate of a W film and an SiON film on a bias power. FIG. 13 shows dependence of a selection ratio between a W film and an SiON film on a bias power.

A constitution (1) of the present invention disclosed by the present specification is a dry etching apparatus for supplying a reaction gas into a chamber under a reduced pressure, and etching a material film to be etched on a substrate disposed on a second electrode by using plasma generated between a first electrode and the second electrode, characterized in that the second electrode is composed of a plurality of electrodes independent from each other, and high-frequency power sources are connected to the respective electrodes independently.

Furthermore, another constitution (2) of the present invention is a dry etching apparatus for supplying a reaction gas into a chamber under a reduced pressure and etching a material film to be etched on a substrate disposed on a second electrode by using plasma generated by application of an AC electric field between a first electrode and the second electrode, characterized in that the first electrode is formed of a plane coil and is connected to a first high-frequency power source, and the second electrode is composed of a plurality of electrodes independent from each other, and second high-frequency power sources are independently connected to the respective electrodes.

In the above-mentioned constitution (1) or (2), the dry etching apparatus is characterized in that the plurality of electrodes constituting the second electrode include an electrode disposed below a central portion of the substrate, and electrodes disposed below corner portions of the substrate.

FIG. 1 shows an exemplary dry etching apparatus having the above-mentioned constitution (1) or (2), the dry etching apparatus being characterized in that an area of the electrode disposed below the central portion of the substrate is larger than that of the electrodes disposed below the corner portions of the substrate.

FIG. 2 shows another exemplary dry etching apparatus having the above-mentioned constitution (1) or (2), the dry etching apparatus being characterized in that the plurality of electrodes constituting the second electrode have the same shape and size.

Furthermore, in each of the above-mentioned constitutions, the dry etching apparatus is characterized in that among the plurality of electrodes constituting the second electrode, a high-frequency power applied to the electrode disposed below the central portion of the substrate is different from that applied to the electrodes disposed below corner portions of the substrate.

Furthermore, in each of the above-mentioned constitutions, the dry etching apparatus is characterized in that among the plurality of electrodes constituting the second electrode, a frequency of a high-frequency power applied to the electrode disposed below the central portion of the substrate is the same as that of a high-frequency power applied to the electrodes disposed below the corner portions of the substrate.

Furthermore, in each of the above-mentioned constitutions, the dry etching apparatus is characterized in that the substrate has an area of 0.3 $m^2$ or more.

Furthermore, another constitution (3) of the present invention is an etching method using a dry etching apparatus provided with a first electrode and a second electrode opposed to each other, characterized by including the steps of: disposing a substrate on the second electrode composed of a plurality of electrodes provided in a chamber; supplying a reaction gas into the chamber under a reduced pressure; and among the plurality of electrodes constituting the second electrode, applying a first high-frequency power to an electrode disposed below a central portion of the substrate and applying a second high-frequency power to electrodes disposed below corner portions of the substrate to supply an AC electric field between the first electrode and the second electrode and generate plasma therebetween, thereby etching a material film to be etched on the substrate disposed on the plurality of electrodes.

In the above-mentioned constitution (3), the etching method is characterized in that a frequency of the first high-frequency power is the same as that of the second high-frequency power.

Furthermore, in the above-mentioned constitution (3), the etching method is characterized in that the dry etching apparatus is a parallel-plate etching apparatus or an ICP-type etching apparatus.

Furthermore, another constitution (4) of the present invention is an etching method using a dry etching apparatus, characterized by including the steps of: disposing a substrate on a plurality of electrodes provided in a chamber; supplying a reaction gas into the chamber under a reduced pressure; and among the plurality of electrodes, applying a first high-frequency power to an electrode disposed below a central portion of the substrate and applying a second high-frequency power to electrodes disposed below corner portions of the substrate to generate plasma with a magnetic field or an electric field, thereby etching a material film to be etched on a substrate disposed on the plurality of electrodes.

Furthermore, in the above-mentioned constitution (4), the etching method is characterized in that the dry etching apparatus is one selected from the group consisting of a magnetron-type etching apparatus, an ECR-type etching apparatus, and a helicon-type etching apparatus.

Furthermore, another constitution (5) of the present invention is a method for forming a wiring, characterized by including the steps of: forming a conductive film on a substrate; selectively forming a mask on the conductive film; disposing the substrate on a second electrode composed of a plurality of electrodes provided in a chamber of a dry etching apparatus provided with a first electrode and the second electrode opposed to each other; supplying a reaction gas into a chamber under a reduced pressure; and among the plurality of electrodes constituting the second electrode, applying a first high-frequency power to an electrode disposed below a central portion of the substrate and applying a second high-frequency power to electrodes disposed below corner portions of the substrate to apply an AC electric field between the first electrode and the second electrode and generate plasma therebetween, thereby selectively etching the conductive film on the substrate disposed on the plurality of electrodes.

In the above-mentioned constitution (5), the method is characterized in that the wiring is a gate electrode or a gate wiring of a TFT. The gate electrode or the gate wiring has a taper shape.

These and other advantages of the present invention will become apparent to those skilled in the art upon reading and understanding the following detailed description with reference to the accompanying drawings.

BRIEF DESCRIPTION OF THE DRAWINGS

In the accompanying drawings:

FIGS. 1A to 1C show a structure of a dry etching apparatus of the present invention;

FIGS. 4A to 4D illustrate production processes of an active matrix type liquid crystal display apparatus;

FIGS. 5A to 5D illustrate production processes of an active matrix type liquid crystal display apparatus;

FIG. 11 shows dependence of a taper angle α on a bias power;

FIG. 12 shows dependence of an etching rate on a bias power;

FIG. 13 shows dependence of a selection ratio on a bias power;

DESCRIPTION OF THE PREFERRED EMBODIMENTS

Figure 2A:
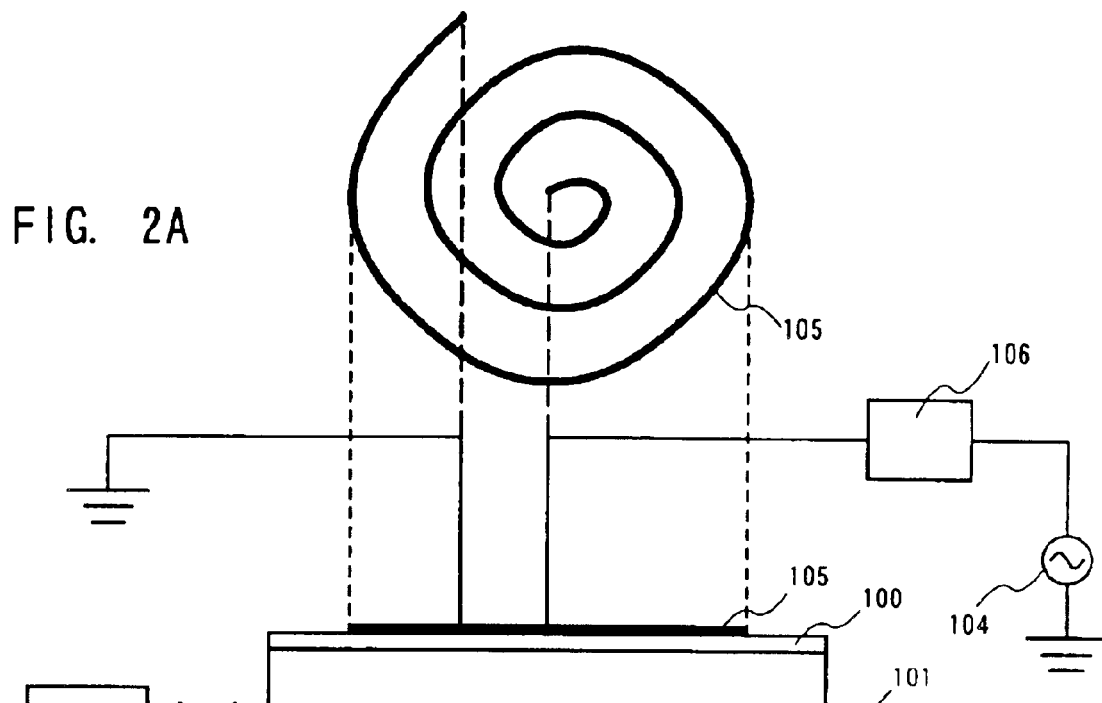
FIGS. 2A to 2C show a structure of a dry etching apparatus of the present invention.

Hereinafter, the present invention will be described by way of illustrative it embodiment modes with reference to the drawings.

Embodiment Mode 1

In Embodiment Mode 1, the present invention is applied to an etching apparatus using inductively coupled plasma, i.e., an ICP type etching apparatus.

FIGS. 1A to 1C show a structure of an ICP type etching apparatus. In FIG. 1B, an upper surface of a chamber 101 in the etching apparatus is made of an insulator 100 such as quartz glass, and a first electrode 105 is disposed outside the insulator 100. FIG. 1A is a top view of the first electrode 105 made of a flat coil. According to the present invention, the first electrode 105 is not limited to the shape shown in FIG. 1, and may have any shape. The first electrode 105 is connected to a first high-frequency power source 104 via a matching circuit 106. A high-frequency current flows through the first electrode 105 to form an electromagnetic wave in the chamber 101, and electrons flowing in the electromagnetic field are allowed to bump into neutral particles of a reaction gas to generate plasma. A predetermined reaction gas is introduced into the chamber 101 from a gas supply system 102, and exhausted from a gas exhaust system 103.

A substrate 107 to be treated is arranged by holding using a clamp (not shown) onto a second electrode composed of a plurality of electrodes 108a to 108d, and 109. When the substrate 107 has an area of 0.3 $m^2$ or more (e.g., 60 cm×72 cm), the insulator 100 may be a disk with a diameter of 98 cm. The cross-section shown in FIG. 1B is taken along an alternate long and short dash line A–A' shown in FIG. 1C. Reference numeral 109 denotes an electrode contacting the central portion of the substrate 107, and reference symbols 108a to 108d denote electrodes contacting corner portions of the substrate 107. The electrodes 108a to 108d, and 109 are electrically insulated from each other with a gap or an insulator. The electrode 108a is connected to a high-frequency power source 110. The electrode 109 is connected to a high-frequency power source 111. The electrode 108c is connected to a high-frequency power source 112. Furthermore, although not shown, the electrodes 108b and 108d are also connected to high-frequency power sources, independently. Herein, these high-frequency power sources are collectively referred to as a second high-frequency power source. According to the present invention, the high-frequency power of the second high-frequency power source is varied to realize uniform etching. A measurement apparatus for measuring an electric power applied to the second electrode and a control portion for controlling a high-frequency power of each high-frequency power source may be provided. Furthermore, by appropriately applying a DC power, an AC power, or a high-frequency energy (microwave, etc.) to the second electrode, etching may be regulated.

Figure 14:
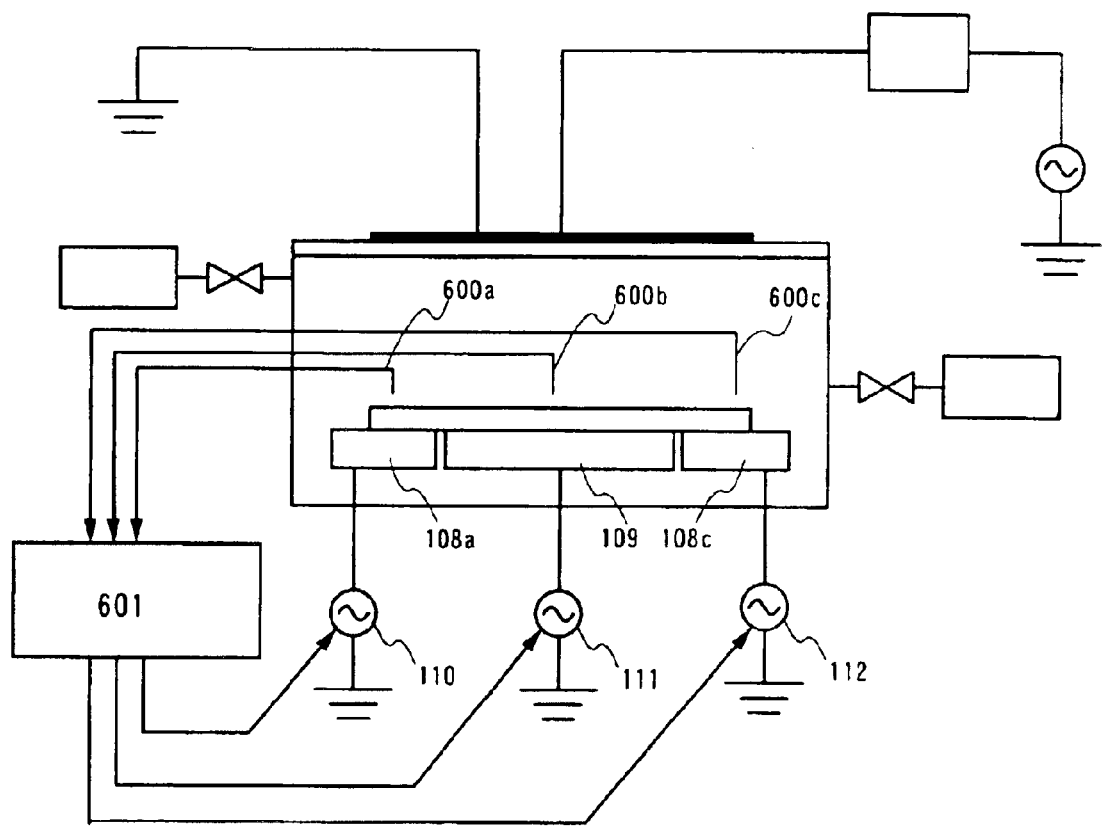
FIG. 14 shows a dry etching apparatus equipped with a control portion.

FIG. 14 shows an exemplary dry etching apparatus equipped with a control portion 601. The apparatus shown in FIG. 14 is the same as that shown in FIG. 1, except for the control portion and the measurement apparatus. Therefore, the same components as those in FIG. 1 are denoted with the same reference numerals as those therein. In FIG. 14, electric powers applied to the second electrode are measured by probes 600a to 600c, and appropriate bias powers are calculated by the control portion 601 equipped with a CPU or the like based on the measured values, whereby an instruction is given to the respective high-frequency power sources 110 to 112. This may be conducted before etching processing to regulate an output of each high-frequency power source. Alternatively, an output of each high-frequency power source may be regulated at any time during etching processing.

Next, etching processes will be described successively by using the etching apparatus shown in FIGS. 1A to 1C.

First, while a predetermined reaction gas is introduced into the chamber 101 under a reduced pressure through the gas supply system 102, the gas is exhausted through the gas exhaust system 103, whereby the inside of the chamber 101 is kept at a predetermined pressure. Then, while the pressure in the chamber 101 is kept, a high-frequency power (typically, 13.56 MHz) is supplied from the first high-frequency power source 104 to the first electrode 105 made of a flat coil. Plasma is generated in the chamber 101, and a material film to be etched on the substrate 107 disposed on the second electrode (108a to 108d, and 109) can be etched. At this time, a high-frequency power is also supplied to the second electrode (108a to 108d, and 109) by the second high-frequency power source (110 to 112). It is preferable that the frequency of each high-frequency power source is the same.

Figure 2B:
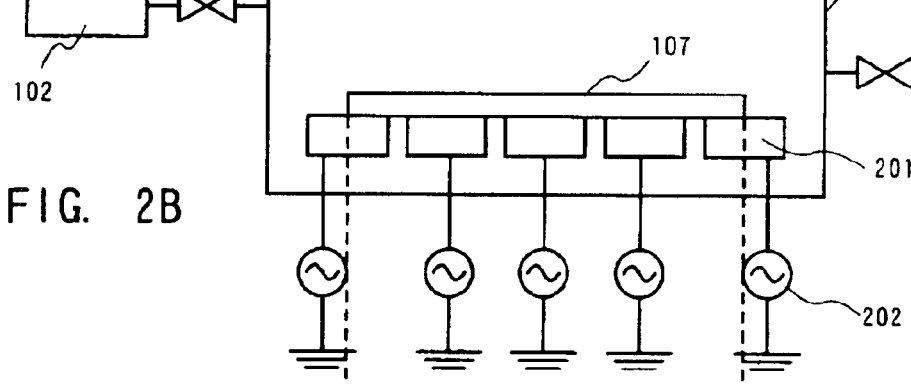
Figure 2C:
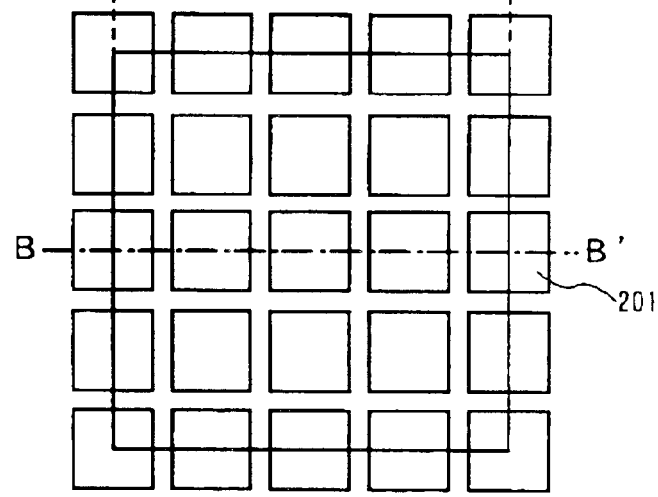

The structure of the second electrode is not limited to that in FIG. 1B. The second electrode may at least include a plurality of electrodes contacting the corner portions of the substrate and an electrode contacting the central portion of the substrate, each electrode having a high-frequency power source. FIGS. 2A to 2C show an example thereof. The structure other than those of the second electrode and the high-frequency power source is the same as that shown in FIG. 1. Therefore, the same components as those in FIG. 1 are denoted with the same reference numerals as those therein. In FIGS. 2A to 2C, a plurality of electrodes 201 arranged in a matrix are disposed as a second electrode, and the electrodes 201 are respectively connected to high-frequency power sources 202. A cross-section shown in FIG. 2B is taken along an alternate long and short dash line A–A' shown in FIG. 2C.

According to the present invention, the second electrode is disposed so that a substantial electric power applied to the entire surface of a substrate becomes uniform, whereby etching variations in a substrate surface can be reduced. In particular, etching defects in the corner portions of the substrate can be reduced. Furthermore, according to the present invention, even with a large substrate, etching with high in-plane uniformity can be realized.

Furthermore, the present invention can be applied to a multi-spiral type ICP etching apparatus in which a coil is divided so as to reduce an inductance of the coil, and a spoke-type ICP etching apparatus in which a comb-shaped coil is disposed in a circular plate.

Furthermore, the present invention is not limited to an ICP-type etching apparatus. The present invention is also applied to an RIE etching apparatus, e.g., a parallel-plate type etching apparatus, an ECR etching apparatus, and a magnetron-type etching apparatus.

Embodiment Mode 2

FIG. 3 shows an example in which the present invention is applied to a parallel-plate type etching apparatus. The parallel-plate type etching apparatus uses capacitive coupling plasma generated by applying a high frequency to electrodes through capacitors.

Reference numeral 305 denotes a first electrode (upper electrode) that is grounded. A high-frequency electric field is applied between the first electrode 305 and a second electrode to ionize a reaction gas in a chamber 301, and a material film to be etched on a substrate 307 to be treated is etched with ions in the reaction gas. A predetermined reaction gas is introduced into the chamber 301 through a gas supply system 302, and exhausted through a gas exhaust system 303.

Figure 3A:
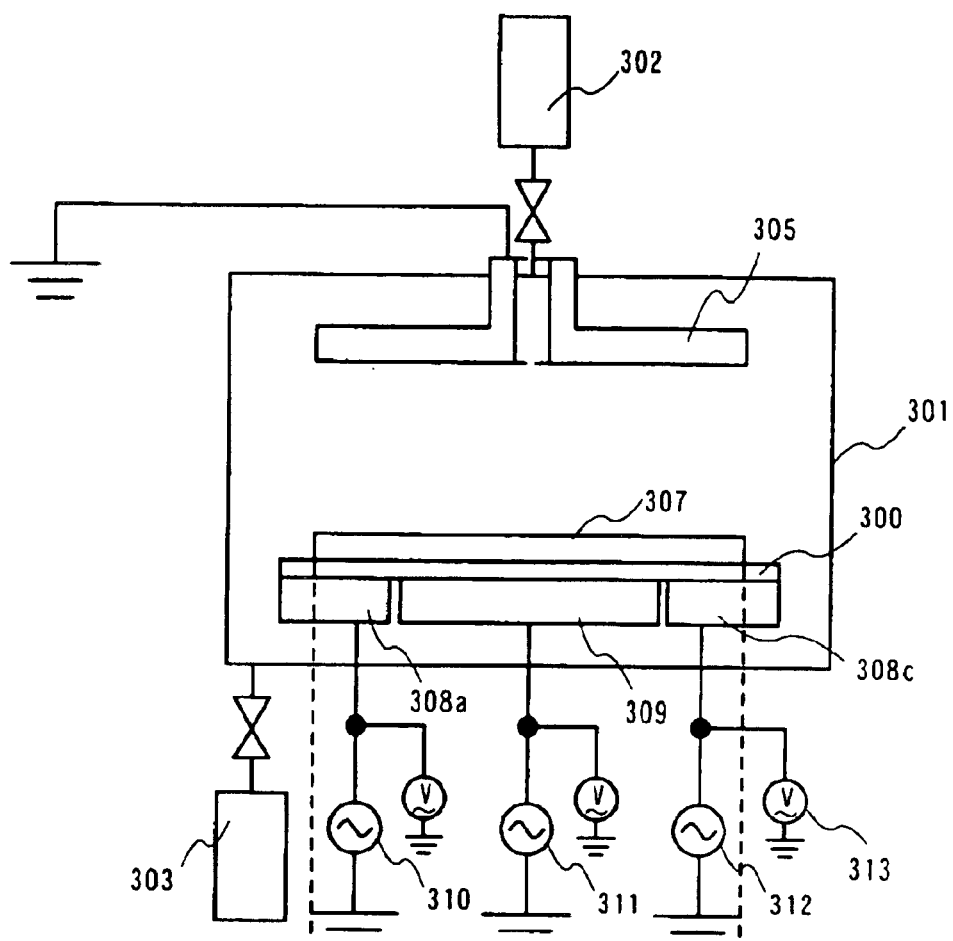
FIGS. 3A and 3B show a structure of a dry etching apparatus of the present invention.
Figure 3B:
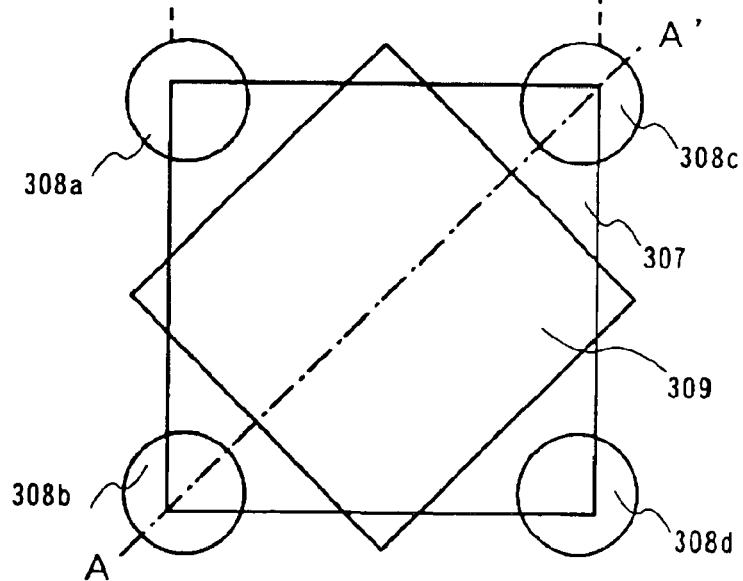

The substrate 307 is placed on a second electrode (lower electrode) composed of a plurality of electrodes 308a to 308d, and 309 via an insulator 300 made of quartz or the like. The electrode 308a disposed below a corner portion of the substrate 307 is connected to a high-frequency power source 310. The electrode 309 disposed below the central portion of the substrate 307 is connected to a high-frequency power source 311. The electrode 308c is connected to a high-frequency power source 312. Furthermore, although not shown, the electrodes 308b and 308d are also connected to high-frequency power sources, independently. Herein, these high-frequency power sources are collectively referred to as a second high-frequency power source. A cross-section shown in FIG. 3A is taken along an alternate long and short dash line A–A' shown in FIG. 3B. Thus, even in the parallel-plate type etching apparatus shown in FIGS. 3A and 3B, a plurality of electrodes constituting the second electrode are connected to the high-frequency power sources 310 to 312, independently.

According to the above-mentioned structure, the second electrode is disposed so that a substantial electric power applied to the entire surface of the substrate becomes uniform, whereby etching variations in a substrate surface can be reduced. In particular, etching defects in the corner portions of the substrate can be reduced. Furthermore, according to the above-mentioned structure, even with a large substrate, etching with high in-plane uniformity can be realized.

Furthermore, a measurement apparatus (prober, voltage measurement equipment, oscilloscope, etc.) 313 is provided between the second electrode and the second high-frequency power source. Furthermore, a control portion for controlling a high-frequency power of each high-frequency power source based on the information obtained by the measurement apparatus 313 may be provided.

In FIG. 3, the substrate 307 is disposed on the second electrode via the insulator 300 made of quartz or the like. However, the substrate 307 may be disposed in contact with the second electrode.

The present invention will be described in more detail by way of illustrative embodiments.

Embodiments

Embodiment 1

In Embodiment 1, an example of a method of manufacturing a liquid crystal display apparatus provided with a pixel portion and a driving circuit on the same substrate will be described with reference to FIGS. 4A to 8.

In the present embodiment, a substrate 401 made of barium borosilicate glass or aluminoborosilicate glass (e.g., #7059 glass and #1737 glass produced by Corning Glass Corp.) is used. There is no particular limit to a substrate as long as it has light transparency. A quartz substrate may be used. A plastic substrate having heat resistance enduring a treatment temperature in the present embodiment may also be used.

An underlying insulating film 402 made of an insulating film such as a silicon oxide film, a silicon nitride film, or a silicon oxide nitride film is formed.

As the underlying insulating film 402, a silicon oxide film, a silicon nitride film, a silicon oxide nitride film ($SiO_xN_y$), a stacked film thereof, or the like can be formed into a thickness of 100 to 500 nm. The underlying insulating film 402 is formed by a known film formation method (thermal CVD, plasma CVD, vapor deposition, sputtering, low-pressure thermal CVD, etc.). Herein, the underlying insulating film 402 is composed of a stack of a silicon oxide nitride film 402a containing nitrogen elements more than oxygen elements in a film composition, and a silicon oxide nitride film 402b containing oxygen elements more than nitrogen elements in a film composition.

An amorphous semiconductor film 403 is formed on the underlying insulating film 402 (FIG. 4A). There is no particular limit to a material for the amorphous semiconductor film 403. An alloy of silicon or silicon germanium ($Si_xGe_{1-x}$ (0<x<1)) or the like may be preferably used. The amorphous semiconductor film 403 can be formed by a known film formation method (thermal CVD, plasma CVD, vapor deposition, sputtering, low-pressure thermal CVD, etc.).

Then, the amorphous semiconductor film 403 is crystallized to form a crystalline semiconductor film 404 (FIG. 4B). As a crystallization method, a known method (solid-phase growth method, laser crystallization, solid-phase growth method using a metal element accelerating crystallization, etc.) can be used. In the present embodiment, a crystalline silicon film is formed by laser crystallization. In the case of forming a crystalline semiconductor film by laser crystallization, a pulse-oscillation type or continuous oscillation type excimer laser, a pulse-oscillation type or continuous oscillation type YAG laser, or a $YVO_4$ laser can be used.

Then, a resist mask is formed by photolithography, followed by etching, whereby semiconductor layers 405 to 409 with a desired shape are formed. If the dry etching apparatus described in Embodiment Mode 1 or 2 is used, etching with excellent in-plane uniformity can be conducted.

Then, impurity elements imparting a p-type (hereinafter, referred to as "p-type impurity elements") are added to the resultant layered structure via a protective film 410 (FIG. 4C). As the p-type impurity elements, those belonging to Group XIII such as boron or gallium can be used. This process (referred to as channel doping) is conducted for the purpose of controlling a threshold voltage of a TFT. Herein, plasma-excited boron is added by ion doping without conducting mass separation of diborane ($B_2H_6$). Needless to say, ion implantation involving mass separation may be used.

In the present embodiment, although channel doping is conducted, it may not be conducted if it is not required.

Then, the protective film 410 is removed. Thereafter, an insulating film 411 (herein, a silicon oxide nitride film) to be a gate insulating film is formed on the semiconductor layers 405 to 409, and first and second conductive films 412 and 413 are formed thereon (FIG. 4D).

As shown in FIG. 5A, a resist mask 414 is formed by photolithography, and first etching processing for forming gate electrodes is conducted. There is no limit to an etching method. However, it is preferable to use ICP (inductively coupled plasma) etching of the present invention. Etching is conducted by using a mixture of $CF_4$ and $Cl_2$ as an etching gas, and generating plasma with an RF (13.56 MHz) electric power of 500 W (electric power density: 1.02 $W/cm^2$) supplied to a coil-shaped electrode under a pressure of 0.5 to 2 Pa, preferably 1 Pa. An area of an electrode on the substrate side is 12.5 cm×12.5 cm, and a diameter of the coil-shaped electrode (herein, quartz disk provided with a coil) is 25 cm. An RF (13.56 MHz) electric power of 100 W (electric power density: 0.64 $W/cm^2$) is also supplied to the substrate side (sample stage), thereby supplying a substantially negative self-bias voltage thereto. In the case of using a mixture of $CF_4$ and $Cl_2$ as an etching gas, a tungsten film, a tantalum nitride film, and a titanium film can also be etched at the same speed.

Under the above-mentioned etching conditions, due to the shape of the resist mask, and the bias voltage applied to the substrate side, the ends of the first and second conductive films 412 and 413 can be tapered. The angle of each taper portion is set to be 15° to 45°. FIG. 11 is a graph showing dependence of a taper angle α on a bias power under the above-mentioned etching, conditions (pressure: 1 Pa, RF electric power: 500 W, gas flow rate $CF_4/Cl_2$=30 sccm/30 sccm). In order to etch the conductive films 412 and 413 so as not to leave a residual on the gate insulating film 411, an etching time may be increased by about 10% to 20%. A selection ratio of a silicon oxide nitride film to a W film is 2 to 4 (typically 3). Therefore, the surface in which the silicon oxide nitride film is exposed by overetching is etched by about 20 to 50 nm. FIG. 12 is a graph showing dependence of an etching rate of the W film and the silicon oxide nitride film on a bias power. FIG. 13 is a graph showing dependence of a selection ratio of the silicon oxide nitride film to the W film on a bias power.

In the present embodiment, the first etching processing is conducted by using the dry etching apparatus (FIG. 1 or 2) and the etching method of the present invention described in Embodiment Mode 1. By using the dry etching apparatus of the present invention, the angle of each taper portion (taper angle) can be made uniform. Herein, a bias power applied to the second electrode is regulated considering the size of the second electrode based on the graph in FIG. 11 to make an electric power density uniform, thereby being capable of obtaining a uniform taper angle in a substrate surface. Low-concentration impurity regions are formed by passing impurities through the taper portions in the later process. Therefore, making the taper portions uniform leads to uniform electric characteristics of all the TFTs formed in a substrate surface. Therefore, it is very useful for reducing variations in a substrate surface to use the etching apparatus of the present invention.

Thus, conductive layers 415 to 420 (composed of first conductive films 415a, 416a, 417a, 418a, 419a and 420a, and second conductive films 415b, 416b, 417b, 418b, 419b and 420b) having a first shape are formed by the first etching processing. Although not shown, regions of the insulating film 411 not covered with the conductive layers 415 to 420 having the first shape are etched by about 20 to 50 nm to become thin.

Then, while the resist mask 414 is retained as it is, doping of n-type impurities (donors) is conducted by using, as a mask, the conductive layers 415 to 420 having the first shape (first doping processing) (FIG. 5B). The first doping processing is conducted, for example, at an acceleration voltage of 20 to 60 keV, and a dose amount of $1\times10^{13}$ to $5\times10^{14}/cm^2$, whereby impurity regions ($n^+$ regions) 421a to 421e are formed. For example, a phosphorus (P) concentration in the impurity regions ($n^+$ regions) is set so as to fall within a range of $1\times10^{20}$ to $1\times10^{21}/cm^3$.

As shown in FIG. 5C, while the resist mask 414 is retained as it is, second etching processing is conducted. The second etching processing is conducted by ICP etching. Etching is conducted by using a mixture of $CF_4$ and $Cl_2$ and $O_2$ as an etching gas, and generating plasma with an RF (13.56 MHz) electric power of 500 W (electric power density: 1.02 $W/cm^2$) supplied to a coil-shaped electrode under a pressure of 1 Pa. An RF (13.56 MHz) electric power of 50 W (electric power density: 0.32 $W/cm^2$) is supplied to the substrate side (sample stage), thereby supplying a self-bias voltage lower than that in the first etching processing to the substrate side. Under such conditions, the tungsten films are subjected to anisotropic etching so that the tantalum nitride films or titanium films (first conductive films) remain. It is also preferable to use the ICP-type etching apparatus of the present invention so as to enhance in-plane uniformity. Thus, conductive layers 423 to 428 (composed of first conductive films 423*a*, 424*a*, 425*a*, 426*a*, 427*a* and 428*a*, and second conductive films 423*b*, 424*b*, 425*b*, 426*b*, 427*b* and 428*b*) having a second shape are formed. Herein, reference numeral 422 denotes the gate insulating film, in which regions not covered with the conductive layers 423 to 428 having the second shape become thinner.

Then, while the resist mask 414 is retained as it is, doping of n-type impurities (donors) is conducted (second doping processing) (FIG. 5D). In this case, the second conductive films of the conductive layers 423 to 428 having the second shape function as a mask with respect to doping elements. Impurity regions (n⁻ regions) 429*a* to 429*e* are formed of impurity elements passing through the gate insulating film 422 and the taper portions of the first conductive films. For example, a phosphorus (P) concentration in the impurity regions (n⁻ regions) is set so as to fall within a range of $1 \times 10^{17}$ to $1 \times 10^{19}/\text{cm}^3$.

In the present embodiment, uniform taper portions are obtained by using the ICP-type etching apparatus of the present invention. Therefore, impurity regions (n⁻ regions) formed by allowing impurity elements to pass through the taper portions can be made uniform in a substrate surface.

Figure 6A:
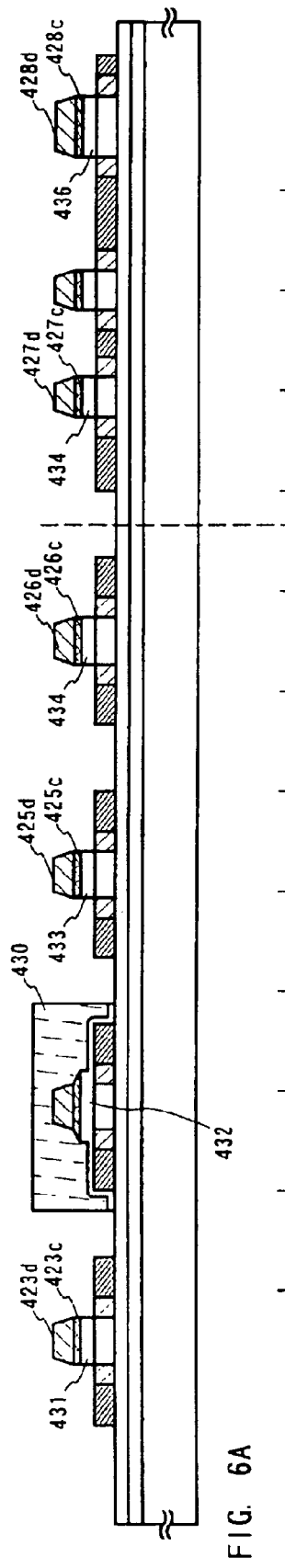
FIGS. 6A to 6C illustrate production processes of an active matrix type liquid crystal display apparatus.

The resist mask 414 is removed. Then, a resist mask 430 is formed by photolithography so as to cover a predetermined TFT among n-channel TFTs in a driving circuit, followed by etching. Accordingly, conductive layers (composed of first conductive films 423*c*, 425*c*, 426*c*, 427*c* and 428*c*, and second conductive films 423*d*, 425*d*, 426*d*, 427*d*, and 428*d*) having a third shape and insulating films 431 to 436 are formed (FIG. 6A). In the TFTs other than that covered with the resist mask 430, the first conductive film is not overlapped with the impurity regions (n⁻ regions). In FIG. 6A, although the insulating films 431, and 433 to 436 are not overlapped with the impurity regions (n⁻ regions), actually they are partially overlapped with each other.

Figure 6B:
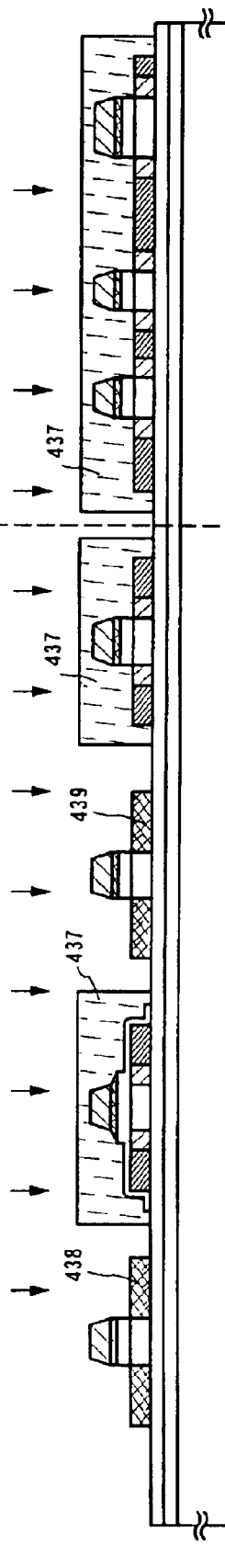

The resist mask 430 is removed. Thereafter, as shown in FIG. 6B, a resist mask 437 is formed, and the island-shaped semiconductor layers in which p-channel TFTs will be formed are doped with p-type impurities (acceptors). Typically, boron (B) is used. Boron is added in a concentration of 1.5 to 3 times that of phosphorus contained in the semiconductor layers to reverse conductivity thereof, in such a manner that each impurity concentration of impurity regions (p⁺regions) 438 and 439 to be obtained becomes $2 \times 10^{20}$ to $2 \times 10^{21}/\text{cm}^3$.

Figure 6C:
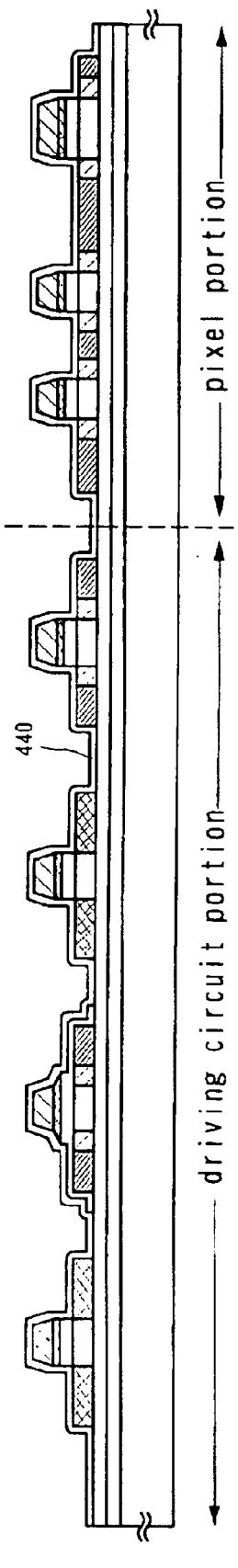

Through the processes up to the above, impurity regions are formed in each semiconductor layer. Thereafter, as shown in FIG. 6C, a protective insulating film 440 made of a silicon nitride film or a silicon oxide nitride film is formed by plasma CVD. For the purpose of controlling conductivity, the impurity elements added to each semiconductor layer are activated.

Furthermore, hydrogenation processing is conducted. In the present embodiment, hydrogen plasma is used since it allows hydrogenation to be conducted at a relatively low temperature.

Then, an interlayer insulating film 441 is formed so as to cover the protective insulating film 440. The interlayer insulating film 441 is made of an organic insulating material such as polyimide and acrylic resin. It is appreciated that a silicon oxide film formed by using tetraethyl orthosilicate (TEOS) by plasma CVD may be used. However, in terms of enhancement of flatness, the organic material is preferably used.

Contact holes are formed. Source/drain lines 442 to 450 and a pixel electrode 451 are formed by using a material excellent in reflectivity, such as a film mainly containing Al or Ag, a Ti film, and a layered film thereof. It is preferable that, after the pixel electrode 451 is formed, the surface of the layered structure thus obtained is made uneven by a known sandblast method, an etching method, or the like to prevent mirror reflection and scatter reflected light, thereby increasing brightness.

In the above-mentioned processes, a driving circuit 453 including n-channel TFTs and p-channel TFTs, and a pixel portion 454 including a pixel TFT and a storage capacitor can be formed on the same substrate.

In the driving circuit 453, a p-channel TFT constituting a logic circuit portion or a sampling circuit portion includes a channel formation region and an impurity region that functions as a source region or a drain region.

In the driving circuit 453, an n-channel TFT constituting the logic circuit portion preferably has a structure based on a high-speed operation. Such a TFT structure includes a channel formation region, an impurity region (gate overlapped drain (GOLD) region) overlapped with a gate electrode, an impurity region (LDD region) formed outside a gate electrode, and an impurity region that functions as a source region or a drain region.

Furthermore, in the driving circuit 453, an n-channel TFT constituting a sampling circuit portion preferably has a structure based on a low off-current operation. Such a TFT structure includes a channel formation region, an impurity region (LDD region) formed outside a gate electrode, and an impurity region that functions as a source region or a drain region.

An n-channel TFT constituting the pixel TFT in the pixel portion 454 preferably has a structure based on a low off-current operation. Such a TFT structure includes a channel formation region, an impurity region (LDD region) formed outside a gate electrode, and an impurity region that functions as a source region or a drain region.

Furthermore, impurity elements imparting a p-type are added to a semiconductor layer functioning as one of electrodes of the storage capacitor 460 in the pixel portion 454. The storage capacitor 460 is formed of electrodes 428*d* and 428*c*, and a semiconductor layer using the insulating film 436 as a dielectric.

Herein, a reflective electrode is used as the pixel electrode. However, a transmission-type display apparatus can be manufactured if the pixel electrode is formed of a conductive material with light transparency. In this case, it is preferable that the pixel electrode is formed before and after the process of producing a source line or a drain line, and as a material for the pixel electrode, an alloy of indium oxide and zinc oxide ($In_2O_3$—ZnO), zinc oxide (ZnO), zinc oxide with gallium (Ga) added thereto (ZnO:Ga), or the like is preferably used.

Figure 7:
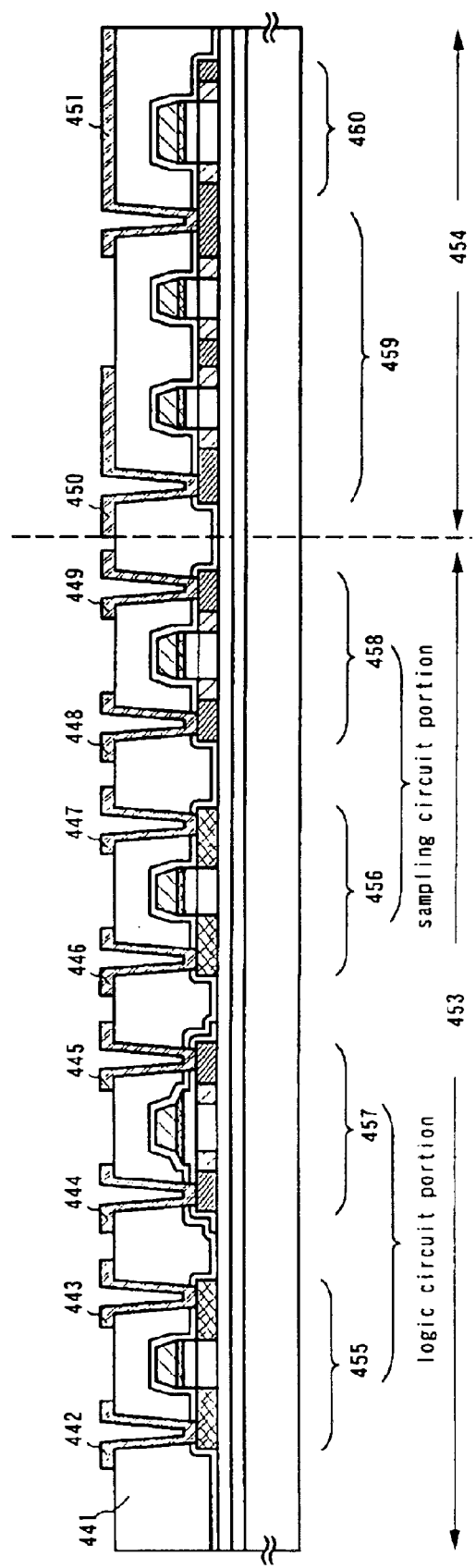
FIG. 7 is a view showing a cross-sectional structure of an active matrix type liquid crystal display apparatus.

After obtaining the state shown in FIG. 7, an orientation film is formed on the pixel electrode 451, followed by conducting rubbing processing. In the present embodiment, before the orientation film is formed, an organic resin film such as an acrylic resin film is patterned to form column-shaped spacers (not shown) at desired positions for the purpose of keeping a substrate gap. In place of the column-shaped spacers, spherical spacers may be dispersed over the entire surface of the substrate.

Then, a counter substrate is prepared. A coloring layer and a light-blocking layer are formed on the counter substrate, and thereafter, a flattening film is formed thereon. Then, a counter electrode made of a transparent conductive film is formed on the flattening film at least in the pixel portion, and an orientation film is formed over the entire surface of the counter substrate, followed by conducting rubbing.

The substrate with the pixel portion and the driving circuit formed thereon is attached to the counter substrate with an adhesive layer (sealant in the present embodiment). Filler is mixed in the adhesive layer. Two substrates are attached to each other while a uniform gap is kept therebetween with the filler and the column-shaped spacers. In the case where a plurality of pixel portions are formed on one substrate (so-called multiple pattern), the substrate is divided to obtain a plurality of substrates each having one pixel portion. Thereafter, a liquid crystal material is injected between the substrates, and completely sealed with a sealant (not shown). As the liquid crystal material, a known liquid crystal material may be used.

Then, a flexible printed circuit (FPC) is attached to an external input terminal. Furthermore, a polarizing plate (not shown) is attached to only the counter substrate. In the case of conducting a color display, a color filter is provided on the counter substrate.

A liquid crystal display apparatus manufactured as described above is used as a display portion of various kinds of electronic equipment. The liquid crystal display apparatus will be described with reference to FIG. 8.

Figure 8:
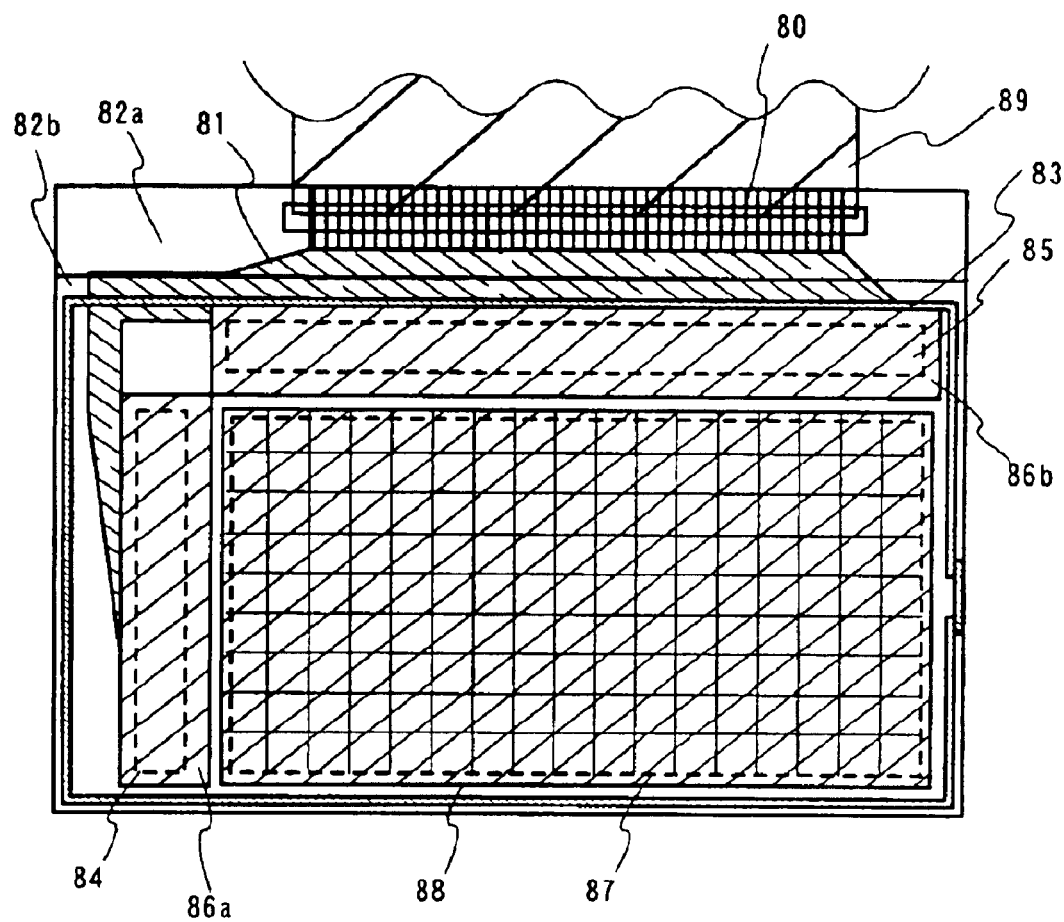
FIG. 8 shows an outer appearance of an active matrix type liquid crystal display apparatus.

As shown in a top view of FIG. 8, a substrate 82a is attached to a counter substrate 82b with a sealant 83. The substrate 82a is provided with a pixel portion, driving circuits, an external input terminal 80 to which an FPC is attached, and a wiring 81 connecting the external input terminal to an input portion of each circuit. The counter substrate 82b is provided with a color filter and the like.

A light-blocking layer 86a is provided on the fixed substrate side so as to be overlapped with a gate-side driving circuit 84, and a light-blocking layer 86b is provided on the fixed substrate side so as to be overlapped with a source-side driving circuit 85. A color filter 88 disposed on the pixel portion 87 on the fixed substrate side is provided in such a manner that a light-blocking layer and a coloring layer of each color (red (R), green (G), and blue (B)) correspond to each pixel. In actual, a color display is conducted with three colors of the coloring layer of red (R), the coloring layer of green (G), and the coloring layer of blue (B). The coloring layers of the respective colors are arranged arbitrarily.

Herein, in order to conduct a color display, the color filter 88 is provided on the counter substrate 82b. However, the present invention is not limited thereto. A color filter may be formed on a substrate when a device is produced thereon.

In the color filter 88, a light-blocking layer is provided in a region between the adjacent pixels, whereby light is blocked in the region other than a display region. Furthermore, the light-blocking layers 86a and 86b are provided so as to cover the driving circuits. However, covers will be placed over the regions of the driving circuits when the liquid crystal display apparatus is incorporated into electronic equipment as a display portion. Therefore, the regions of the driving circuits may not be covered with the light-blocking layers. Furthermore, when a required element is produced on the substrate, a light-blocking layer may be formed thereon.

Furthermore, the following may also be possible. Instead of providing the above-mentioned light-blocking layers, a plurality of stacked coloring layers constituting a color filter are appropriately disposed between a second fixed substrate and the counter substrate, whereby light is blocked in the region (gap between the respective pixel electrodes) other than a display region and driving circuits.

Furthermore, an FPC 89 composed of a base film and a wiring is attached to the external input terminal with anisotropic conductive resin. Furthermore, the mechanical strength of the apparatus is enhanced with a reinforcing plate.

Embodiment 2

Figure 9A:
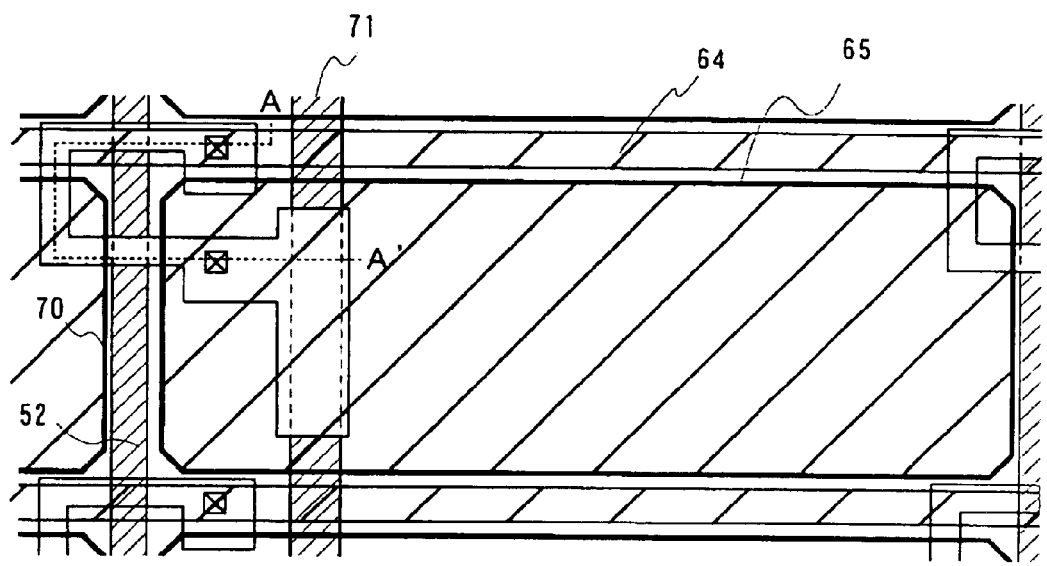
FIGS. 9A and 9B are a top view and a cross-sectional view of a pixel in an active matrix type liquid crystal display apparatus, respectively.
Figure 9B:
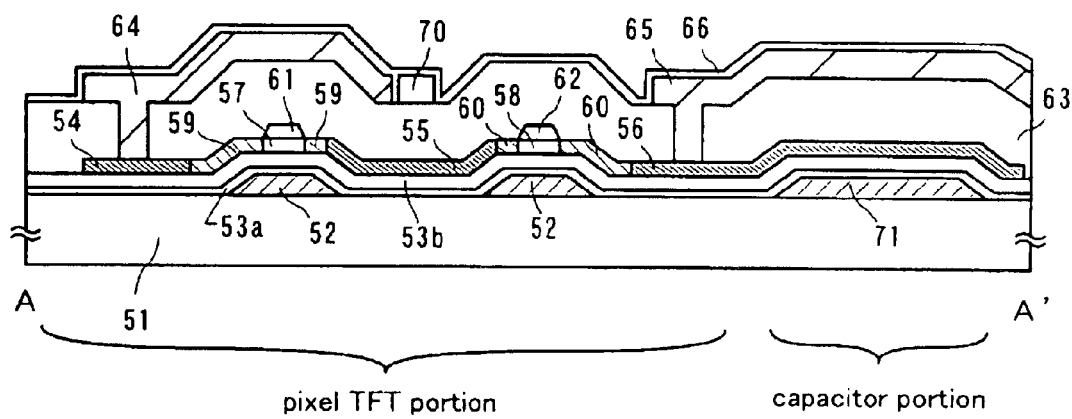

In the present embodiment, a liquid crystal display apparatus will be described with reference to FIGS. 9A and 9B, in which a TFT used in a pixel portion or a driving circuit is made of a reverse stagger TFT. FIG. 9A is a top view showing one enlarged pixel in the pixel portion. FIG. 9B is a cross-sectional view of the pixel portion taken along a dotted line A–A' in FIG. 9A.

In the pixel portion, a pixel TFT portion is formed of an n-channel TFT. An active layer of the TFT may be either a semiconductor film with an amorphous structure (typically, an amorphous silicon film) or a semiconductor film having a crystal structure (typically, polysilicon film). In the case of forming a driving circuit and a pixel portion on the same substrate, a semiconductor film having a crystal structure is preferably used. A gate electrode 52 is formed on a substrate 51. A first insulating film 53a made of silicon nitride and a second insulating film 53b made of silicon oxide are provided on the gate electrode 52. The first and second insulating films 53a and 53b have a function of a gate insulating film. Furthermore, $n^+$ regions 54 to 56 as an active layer, and channel formation regions 57 and 58 are formed on the second insulating film 53b, and $n^{31}$ regions 59 and 60 are formed between the $n^+$ region and the channel formation region. The channel formation regions 57 and 58 are protected with insulating layers 61 and 62. After contact holes are formed in a first interlayer insulating film 63 covering the insulating layers 61 and 62 and the active layer, a wiring 64 connected to the $n^+$ region 54 is formed, and a pixel electrode 65 made of Al or Ag is connected to the $n^+$ region 56. Then, a passivation film 66 is formed on the wiring 64 and the pixel electrode 65. Reference numeral 70 denotes a pixel electrode adjacent to a pixel electrode 69.

In the present embodiment, a gate wiring of the pixel TFT in the pixel portion has a double-gate structure. However, in order to reduce variations in an off-current, the pixel portion may have a multi-gate structure such as a triple-gate structure. Furthermore, in order to enhance an aperture ratio, the pixel portion may have a single gate structure.

A capacitor portion in the pixel portion is formed of capacitor wiring 71 and the $n^+$ region 56 using the first and second insulating films 53a and 53b as a dielectric.

The pixel portion in FIG. 9 is shown only for the illustrative purpose. It should be understood that the present invention is not limited to the above-mentioned structure.

The present embodiment can be combined with any of Embodiment Modes 1 and 2, and Embodiment 1.

The etching apparatus of the present invention exemplified in Embodiment Modes 1 and 2 can be used for etching in each pattering process. In particular, when used in etching processing for patterning the gate electrode 52, the etching apparatus of the present invention is capable of making taper portions of the gate electrode 52 uniform, and making coverage of the gate insulating film covering the gate electrode 52 satisfactory. According to the present invention, even if a substrate to be treated is enlarged, etching processing excellent in in-plane uniformity with high precision can be conducted without causing etching defects in corner portions of the substrate to be treated.

Embodiment 3

In the present embodiment, an exemplary method of manufacturing a self light-emitting display apparatus equipped with an electroluminescence (EL) element will be described with reference to FIGS. 10A and 10B.

Figure 10A:
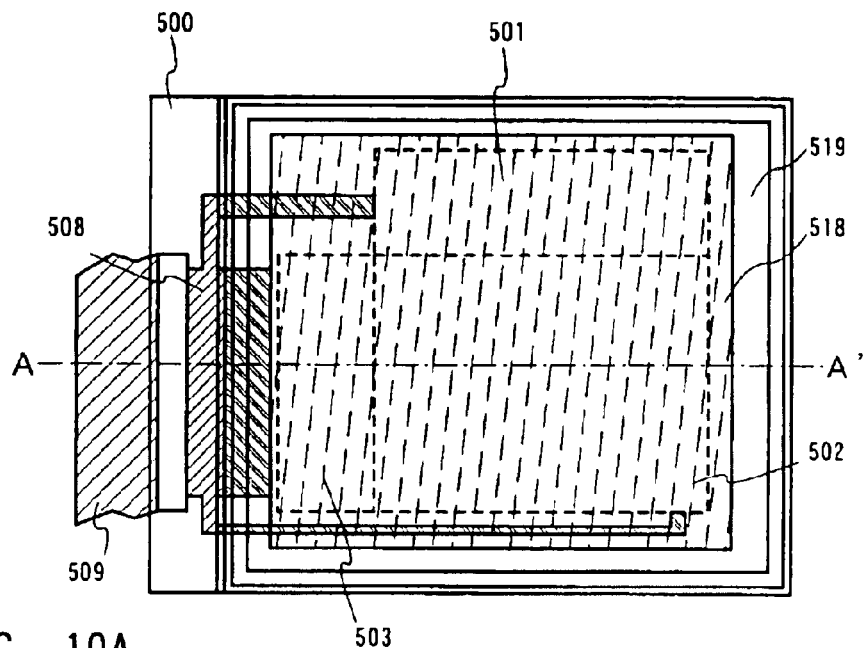
FIGS. 10A and 10B are a plan view and a cross-sectional view of an active matrix type EL display apparatus, respectively.
Figure 10B:
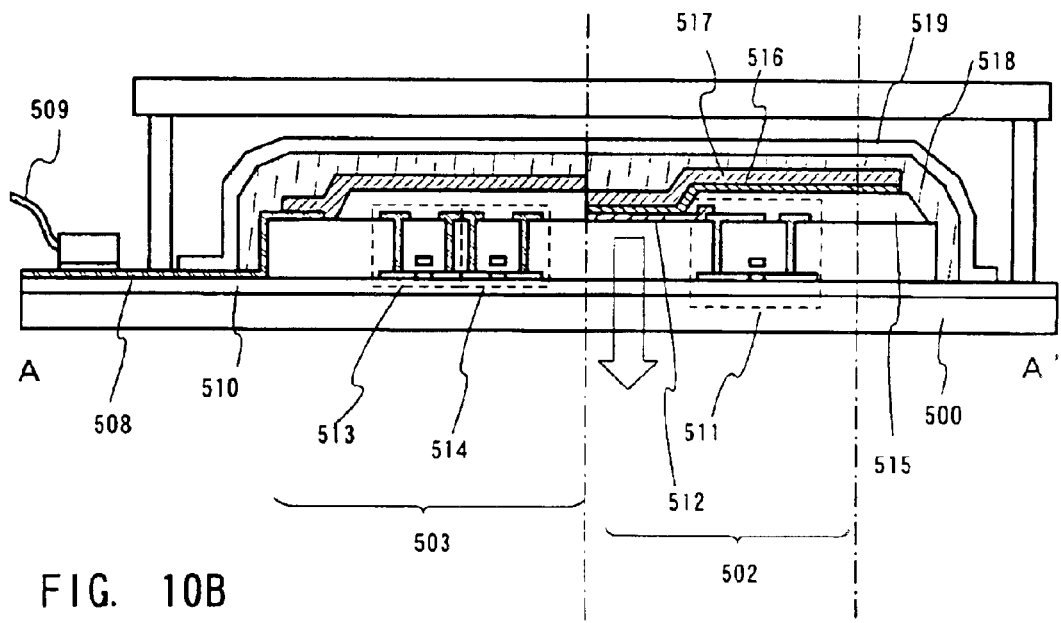

FIG. 10A is a top view showing an EL module, and FIG. 10B is a cross-sectional view taken along a line A–A' in FIG. 10A. A pixel portion 502, a source-side driving circuit 501, and a gate-side driving circuit 503 are formed on a substrate 500 (e.g., a glass substrate, a crystalline glass substrate, a plastic substrate, etc.) having an insulating surface. Reference numerals 518 and 519 denote a sealant and a DLC film, respectively. The pixel portion 502 and the driving circuits 501 and 503 are covered with the sealant 518. The sealant 518 is covered with the protective film 519. Furthermore, an EL element is seated with a cover material using an adhesive.

Reference numeral 508 denotes a wiring for transmitting a signal input to the source-side driving circuit 501 and the gate-side driving circuit 503, which receives a video signal and a clock signal from an FPC 509 to be an external input terminal. Herein, although only the FPC is shown, the FPC may be provided with a printed wiring board (PWB). In the present specification, the self light-emitting apparatus includes not only an apparatus itself, but also an apparatus provided with an FPC or a PWB.

Next, a cross-sectional structure of the apparatus will be described with reference to FIG. 10B. An insulating film 510 is formed on the substrate 500. The pixel portion 502 and the gate-side driving circuit 503 are formed above the insulating film 510. The pixel portion 502 is composed of a plurality of pixels including a current control TFT 511 and a pixel electrode 512 electrically connected to a drain of the current control TFT 511. Furthermore, the gate-side driving circuit 503 is composed of a CMOS circuit including a combination of an n-channel TFT 513 and a p-channel TFT 514.

If the etching apparatus of the present invention is used in patterning for producing the TFTs (including TFTs 511, 513, and 514), high in-plane uniformity can be realized in the shape of semiconductor layers, a wiring width, or the shape of contact holes.

The pixel electrode 512 functions as an anode of an EL element. Furthermore, banks 515 are formed at both ends of the pixel electrode 512, and an EL layer 516 and a cathode 517 of the EL element are formed on the pixel electrode 512.

The EL layer 516 (for emitting light and moving carriers for light emission) may be formed by arbitrarily combining a light-emitting layer, a charge transporting Layer, or a charge injection layer. For example, a low-molecular organic EL material or a high-molecular organic EL material may be used. As the EL layer 516, a thin film made of a light-emitting material (singlet compound) that emits light (fluoresces) due to single excitation, or a thin film made of a light-emitting material (triplet compound) that emits light (phosphoresces) due to triple excitation may be used. Furthermore, as the charge transporting layer or the charge injection layer, an inorganic material such as silicon carbide can be used. As the organic EL material or inorganic material, known materials can be used.

The cathode 517 functions as a wiring common to all the pixels, and is electrically connected to the FPC 509 via the connection wiring 508. Furthermore, all the elements included in the pixel portion 502 and the gate-side driving circuit 503 are covered with the cathode 517, the sealant 518, and the protective film 519.

It is preferable that a material transparent or semi-transparent to visible light is used for the sealant 518. It is also preferable that the sealant 518 is made of a material that transmits as less moisture and oxygen as possible.

After the EL element is completely covered with the sealant 518, the protective film 519 made of a DLC film or the like is preferably provided over at least the surface (exposed surface) of the sealant 518 as shown in FIG. 10B. The entire surface of the substrate including a reverse surface thereof may be provided with the protective film.

Herein, care should be taken so that the protective film is not formed in a portion where the external input terminal (FPC) is provided. In this case, the protective film may be prevented from being formed on the external input terminal using a mask. Alternatively, the protective film may be prevented from being formed on the external input terminal by covering it with a tape such as Teflon used as a masking tape in a CVD apparatus.

By sealing the EL element with the sealant 518 and the protective film 519 in the above-mentioned structure, the EL element can be completed cut off from outside, and a substance causing degradation of the EL element due to oxidation of the EL layer, such as moisture and oxygen, can be prevented from entering the apparatus from outside. Accordingly, a self light-emitting apparatus with high reliability can be obtained.

The present embodiment can be combined with any of Embodiment Modes 1 and 2, and Embodiments 1 and 2.

The etching apparatus exemplified in Embodiment Modes 1 and 2 can be used for etching processing for producing a TFT in the pixel portion or a TFT in the driving circuit shown in FIGS. 10A and 10B (e.g. formation of a electrode or contact hole). According to the present invention, even if a substrate to be treated is enlarged, etching processing excellent in in-plane uniformity with high precision can be conducted without causing etching defects in corner portions of the substrate to be treated.

The pixel electrode may be made of a cathode, and the EL layer and the anode are a stacked so as to emit light in a direction opposite to that in FIG. 10B.

Embodiment 4

In Embodiment 4, an etching apparatus adopting the present invention will be described with reference to FIGS. 15A and 15B. In this apparatus, a radial line slot antenna (RLSA) is used as a microwave supply unit.

Figure 15A:
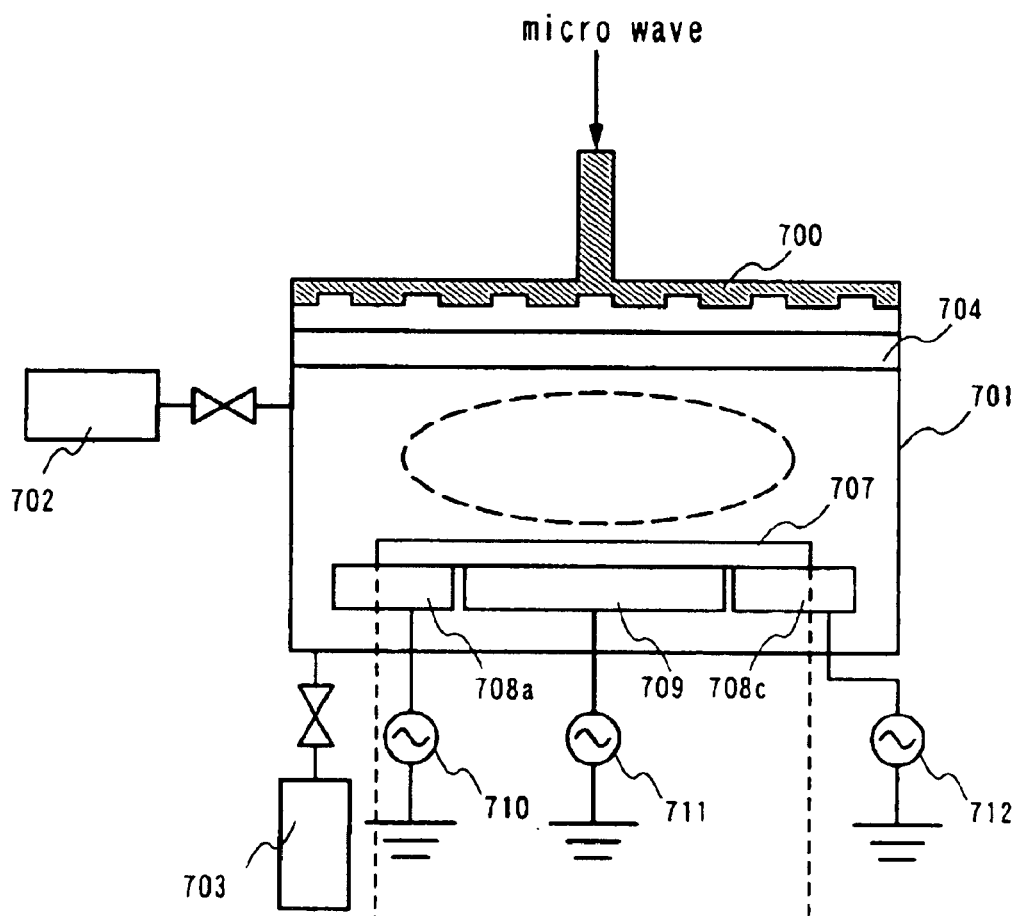
FIGS. 15A and 15B show a structure of a dry etching apparatus of the present invention.
Figure 15B:
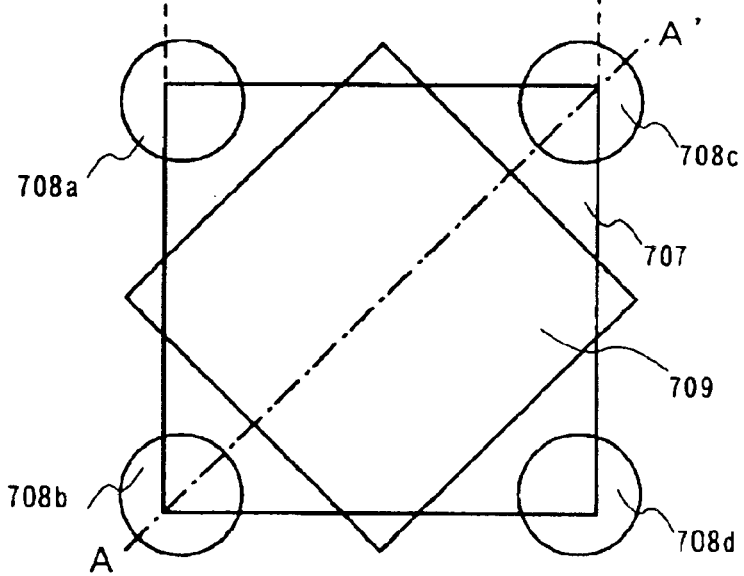

In FIGS. 15A and 15B, reference numerals 700 and 704 denote an RLSA and a microwave-transmittable dielectric, respectively. Plasma is generated between the antenna 700 and electrodes 708, 709 by supplying a microwave from the antenna 700, thereby etching a material film to be etched, which is provided on a substrate 707 to be treated. A predetermined reaction gas is introduced into a chamber 701 from a gas supply system 702, and exhausted from a gas exhaust system 703.

The substrate 707 is disposed on a second electrode (lower electrode) composed of a plurality of electrodes 708a to 708d, and 709. The electrode 708a disposed below a corner portion of the substrate 707 is connected to a high-frequency power source 710, and the electrode 709 disposed below a central portion of the substrate 707 is connected to a high-frequency power source 711. The electrode 708c is connected to a high-frequency power source 712. Although not shown, the electrodes 708b and 708d are also connected to high-frequency power sources, respectively. The cross-sectional view shown in FIG. 15A is taken along an alternate long and short dash line A–A' shown in FIG. 15B. Thus, in the etching apparatus shown in FIG. 15, high-frequency power sources 710 to 712 are connected to a plurality of electrodes constituting the second electrode, respectively.

According to the above-mentioned structure, variations in etching in a substrate surface can be reduced, and in particular, etching defects at corner portions of the substrate can be reduced. Furthermore, according to the above-mentioned structure, even if a substrate to be treated is enlarged, etching processing excellent in in-plane uniformity can be conducted.

A measurement apparatus (prober, voltage measurement equipment, oscilloscope, etc.) may be provided between the second electrode and the high-frequency power sources. Furthermore, a control portion for controlling a high-frequency power of each high-frequency power source based on the information obtained by the measurement apparatus may be provided.

The present embodiment can be combined with any of Embodiment Modes 1 and 2, and Embodiments 1 to 3.

Embodiment 5

Figure 16A:
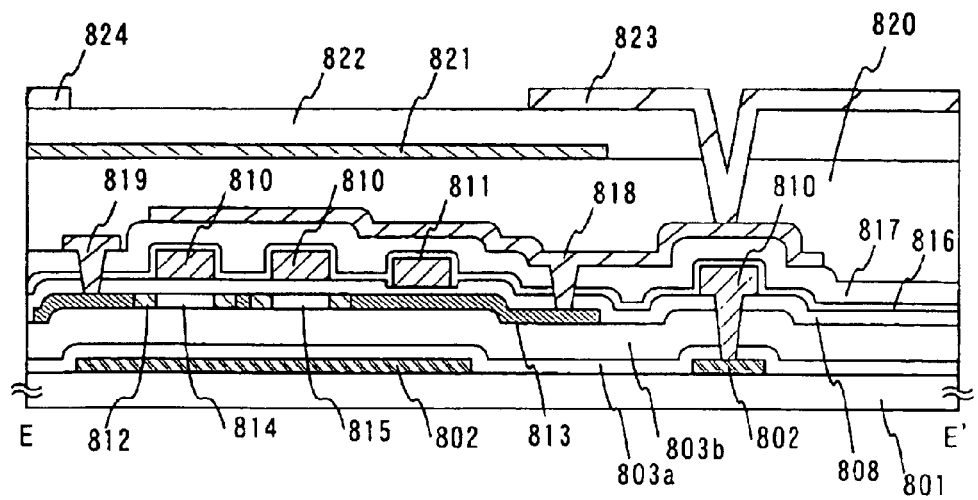
FIGS. 16A and 16B are a plan view and a cross-sectional view of a pixel in an active matrix type liquid crystal display apparatus, respectively.
Figure 16B:
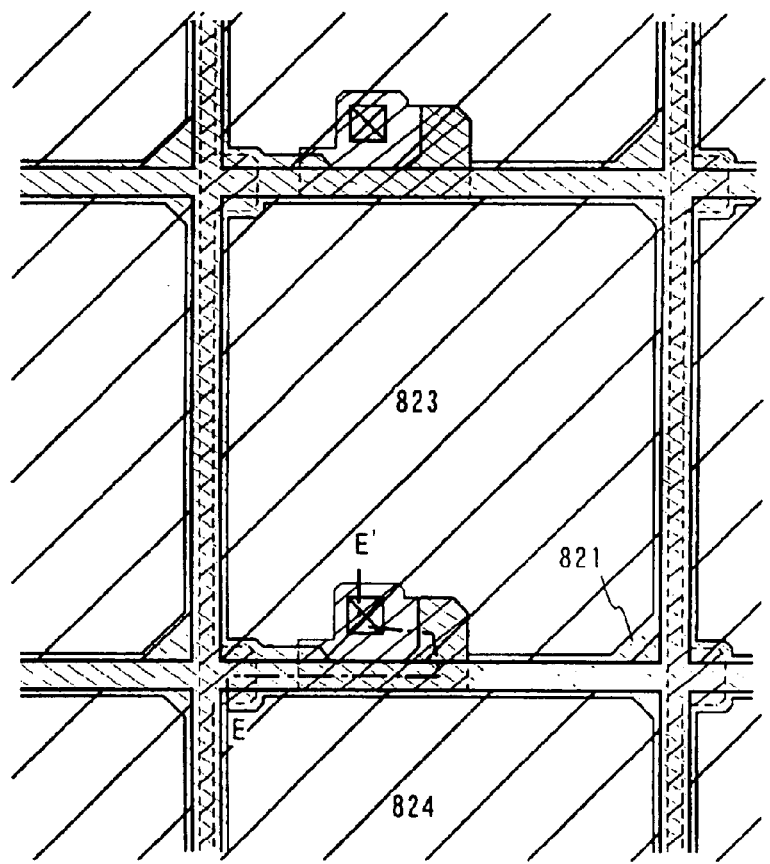

In Embodiment 5, an exemplary liquid crystal display apparatus will be described with reference to FIGS. 16A and 16B, in which a gate wiring that also functions as a light-blocking film is provided below an n-channel TFT used in a pixel portion. FIG. 16B is a plan view showing one enlarged pixel in a pixel portion. FIG. 16A is a cross-sectional view taken along a broken line E–E' in FIG. 16B.

In FIGS. 16A and 16B, reference numeral 801 denotes a substrate, 802 denotes gate wiring, 803a and 803b denote insulating films covering the gate wiring 802, 808 denotes a gate insulating film, 810 denotes a gate electrode, and 811 denotes a capacitance line. The gate wiring 802 also functions as a light-blocking layer that protects an active layer from light. The active layer is composed of regions 812 to 815. Reference numeral 812 denotes low-concentration impurity regions to be LDD regions, 813 denotes high-concentration impurity regions to be source regions or drain regions to which phosphorus is added in a high concentration, and 814 and 815 denote channel formation regions. The low-concentration impurity regions 812 are doped by a self-alignment manner, and are not overlapped with gate electrode 810.

In FIGS. 16A and 16B, reference numeral 816 denotes a passivation film, 817 denotes an interlayer insulating film made of an organic resin material, 818 denotes an electrode connecting pixel electrodes to the high-concentration impurity regions, 819 denotes source lines, 820 denotes an interlayer insulating film made of acrylic resin, 821 denotes a light-blocking layer, 822 denotes an interlayer insulating film, and 823 and 824 denote pixel electrodes made of transparent conductive films.

The present invention can be applied to etching processing used for producing a pixel TFT shown in FIGS. 16A and 16B.

Figure 17:
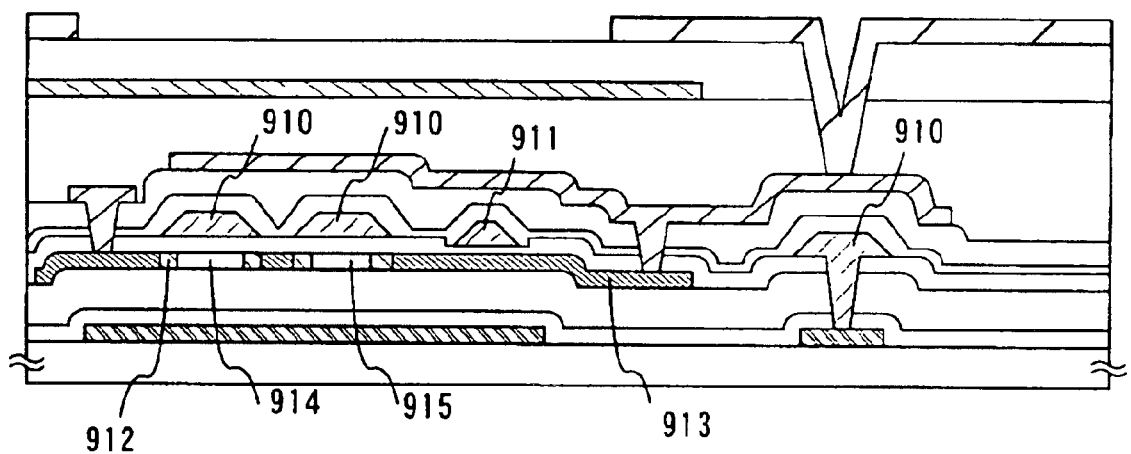
FIG. 17 is a cross-sectional view of a pixel in an active matrix type liquid crystal display apparatus.

FIG. 17 shows another exemplary liquid crystal display apparatus, which is the same as that shown in FIGS. 16A and 16B except for the structure of a gate electrode and that of an active layer. Thus, the description of the components other than the gate electrode and the active layer will be omitted here.

In FIG. 17, an active layer is composed of high-concentration impurity regions 913, low-concentration impurity regions 912, and channel formation regions 914 and 915. In FIG. 17, gate electrodes 910 and a capacitance line 911 are tapered. Phosphorus is doped by passing through the taper portions at a time of doping, whereby the low-concentration impurity regions 912 are formed. Therefore, the low-concentration impurity regions 912 are partially overlapped with the gate electrodes 910.

The present embodiment can be combined with any of Embodiment Modes 1 and 2, and Embodiments 1 to 3.

The present invention exemplified in Embodiment Modes 1 and 2 can be applied to etching processing used for producing the pixel TFT shown in FIGS. 16A and 16B, for example, for forming a tapered gate electrode and for forming a contact hole. According to the present invention, even if a substrate to be treated is enlarged, etching processing excellent in in-plane uniformity with high precision can be conducted without causing etching defects at corner portions of the substrate to be treated.

Embodiment 6

The driver circuit and the pixel portion fabricated by implementing the present invention can be utilized for various devices (active matrix liquid crystal display, active matrix EL module and active matrix EC display). The present invention can be applied to etching processing used for producing a TFT in the pixel portion or a TFT in the driving circuit, for example, for forming a tapered gate electrode and for forming a contact hole. Namely, the present invention can be implemented onto all of the electronic devices that incorporate such devices .

Following can be given as such electronic devices: video cameras; digital cameras; head mounted displays (goggle type displays); car navigation systems; projectors (rear type or front type); car stereo; personal computers; portable information terminals (mobile computers, portable telephones or electronic books etc.) etc. Examples of these are shown in FIGS. 18 to 20.

Figures 18A, 18B:
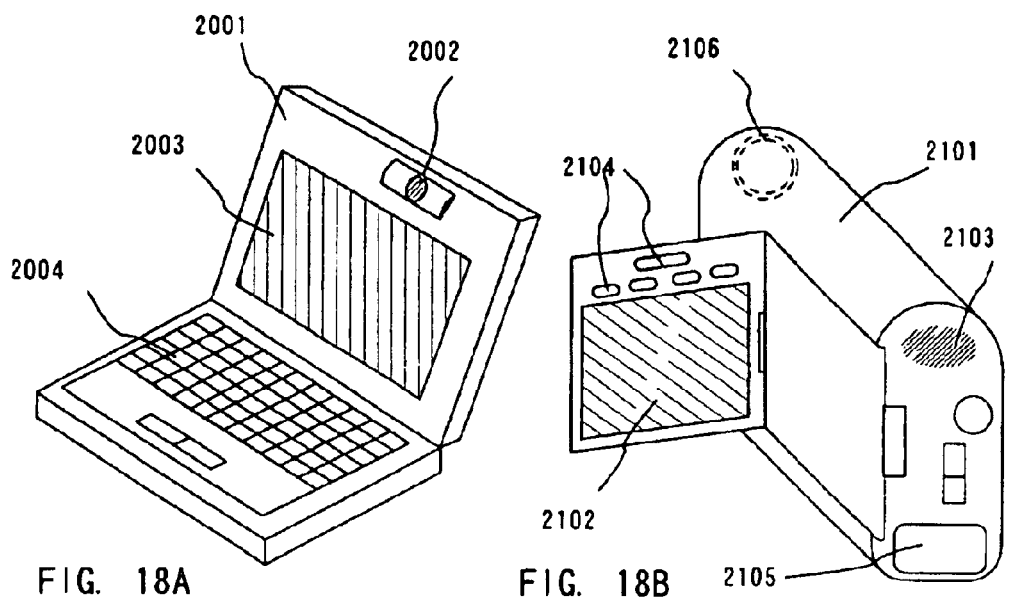
FIGS. 18A to 18F show examples of electronic equipment.

FIG. 18A is a personal computer which comprises: a main body 2001; an image input section 2002; a display section 2003; and a keyboard 2004.

FIG. 18B is a video camera which comprises: a main body 2101; a display section 2102; a voice input section 2103; operation switches 2104; a battery 2105 and an image receiving section 2106.

Figures 18C, 18D:
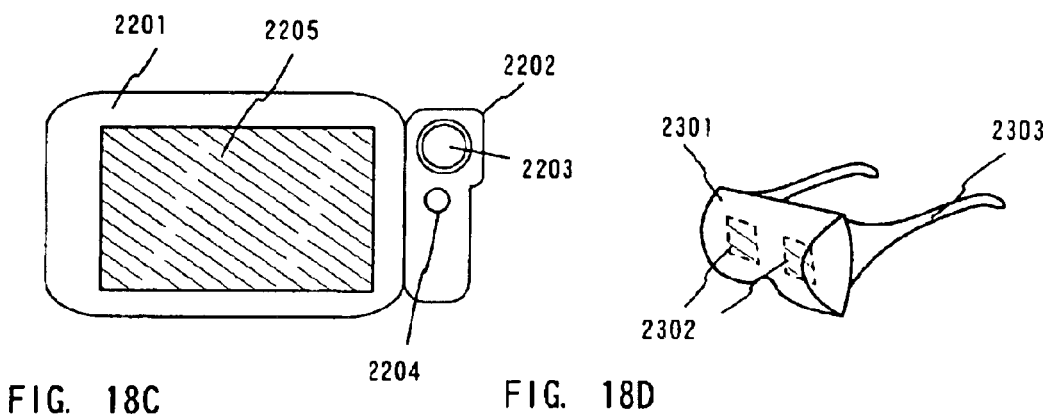

FIG. 18C is a mobile computer which comprises: a main body 2201; a camera section 2202; an image receiving section 2203; operation switches 2204 and a display section 2205.

FIG. 18D is a goggle type display, which comprises: a main body 2301; a display section 2302; and an arm section 2303.

Figures 18E, 18F:
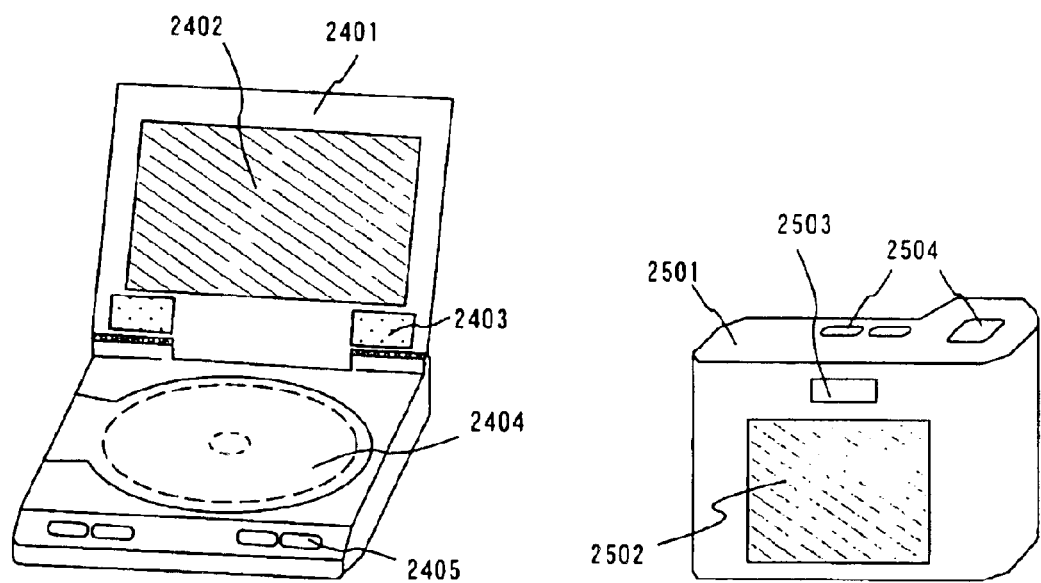

FIG. 18E is a player using a recording medium which records a program (hereinafter referred to as a recording medium) which comprises: a main body 2401; a display section 2402; a speaker section 2403; a recording medium 2404; and operation switches 2405. This device uses DVD (digital versatile disc), CD, etc. for the recording medium, mind can perform music appreciation, film appreciation, games and the use for Internet.

FIG. 18F is a digital camera which comprises: a main body 2501; a display portion 2502; a view finder 2503; operation switches 2504; and an image receiving section (not shown in the figure).

Figure 19A:
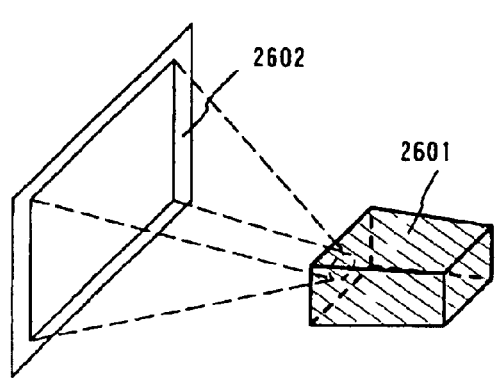
FIGS. 19A to 19D show examples of electronic equipment.

FIG. 19A is a front type projector which comprises: a projection system 2601; and a screen 2602. The present invention can be applied to the manufacturing method of the liquid crystal display device 2808 which forms a part of the projection system 2601.

Figure 19B:
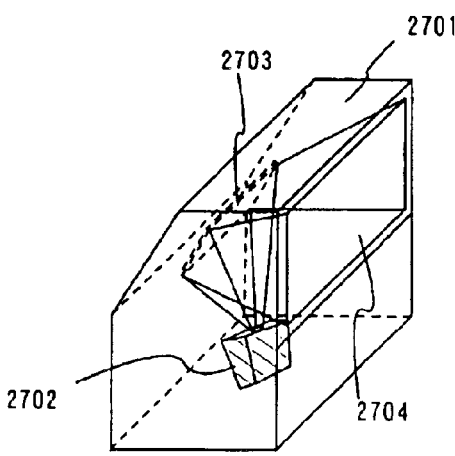

FIG. 19B is a rear type projector which comprises: a main body 2701; a projection system 2702; a mirror 2703; and a screen 2704.

Figure 19C:
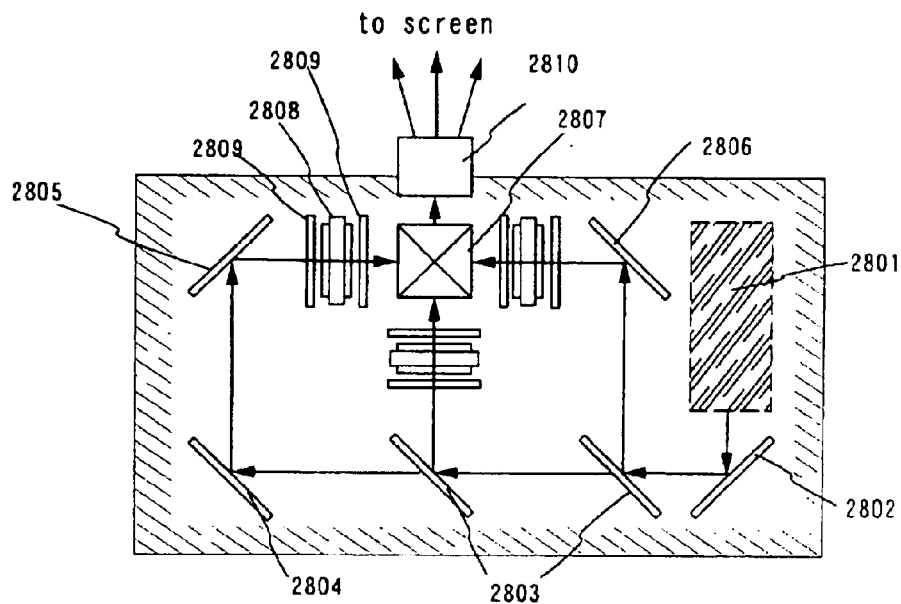

FIG. 19C is a diagram which shows an example of the structure of a projection system 2601 and 2702 in FIGS. 19A and 19B. Projection systems 2601 and 2702 comprise: an optical light source system 2801; mirrors 2802 and 2804 to 2806; a dichroic mirror 2803; a prism 2807; a liquid crystal display device 2808; a phase differentiating plate 2809; and a projection optical system 2810. The projection optical system 2810 comprises an optical system having a projection lens. Though the present embodiment shows an example of 3-plate type, this is not to limit to this example and a single plate type may be used for instance. Further, an operator may appropriately dispose an optical lens, a film which has a function to polarize light, a film which adjusts a phase difference or an IR film, etc in the optical path shown by an arrow in FIG. 19C.

Figure 19D:
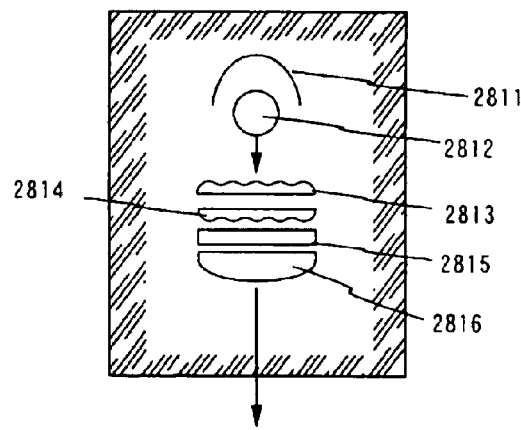

FIG. 19D is a diagram showing an example of a structure of an optical light source All system 2801 in FIG. 19C. In the present embodiment the optical light source system 2801 comprises: a reflector 2811; a light source 2812; lens arrays 2813 and 2814; a polarizer conversion element 2815; and a condensing lens 2816. Note that the optical light source system shown in FIG. 19D is merely an example and the structure is not limited to this example. For instance, an operator may appropriately dispose an optical lens, a film that has a function to polarize light, a film that adjusts a phase difference or an IR film, etc.

Note that the projectors shown FIG. 19 are the cases of using transmission type electro-optical devices, and applicable examples of a reflection type electro-optical device and an EL module device are not shown.

Figure 20A:
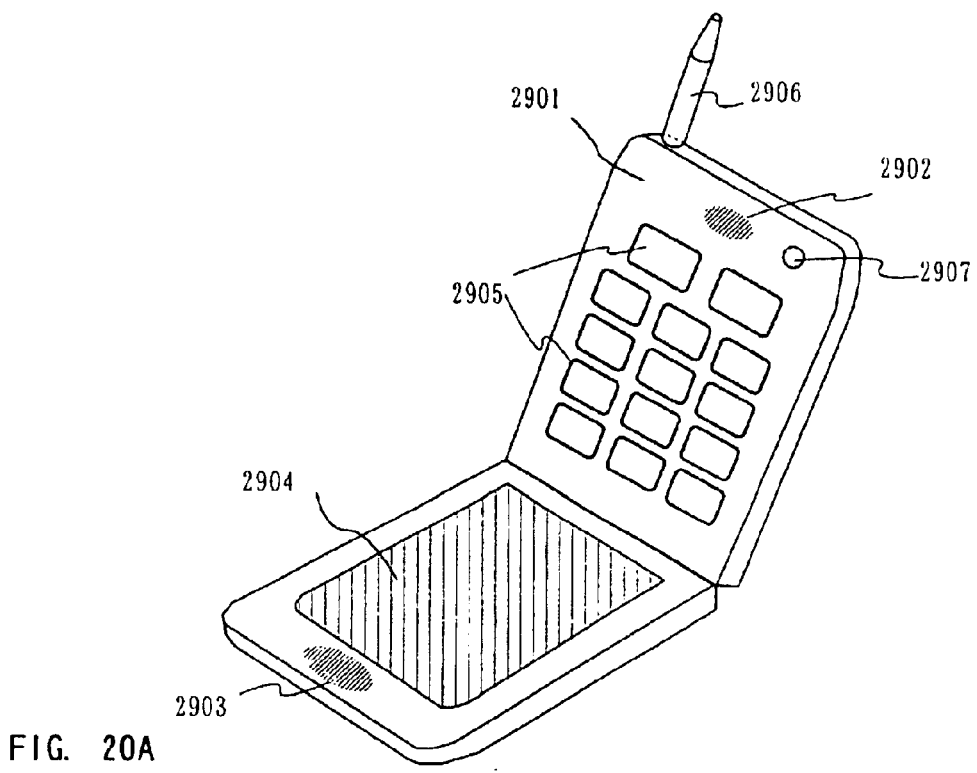
FIGS. 20A to 20C show examples of electronic equipment.

FIG. 20A is a portable telephone which comprises: a main body 2901; a voice output section 2902; a voice input section 2903; a display section 2904; operation switches 2905; an antenna 2906 an image input portion (CCD, image sensor etc.) 2907 etc.

Figure 20B:
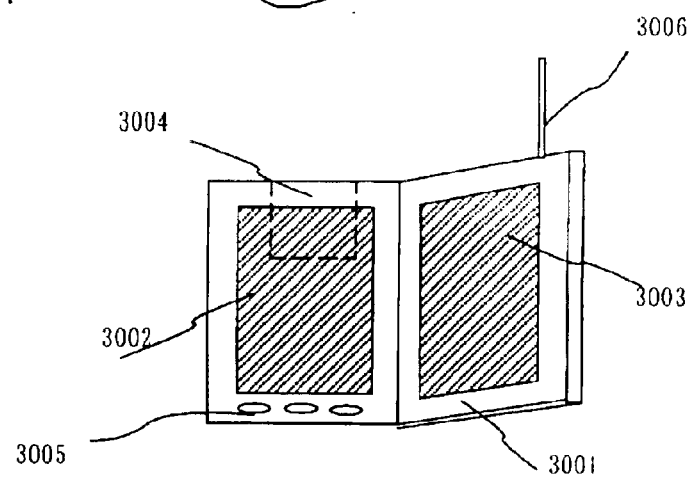

FIG. 20B is a portable book (electronic book) which comprises: a main body 3001; display sections 3002 and 3003; a recording medium 3004; operation switches 3005 and an antenna 3006 etc.

Figure 20C:
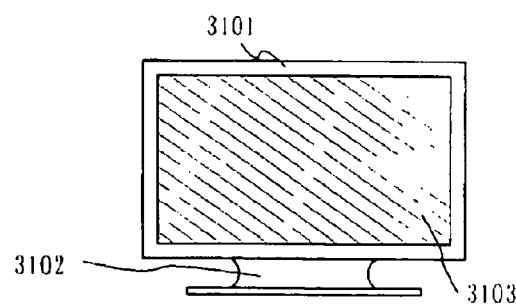
Figure 21A:
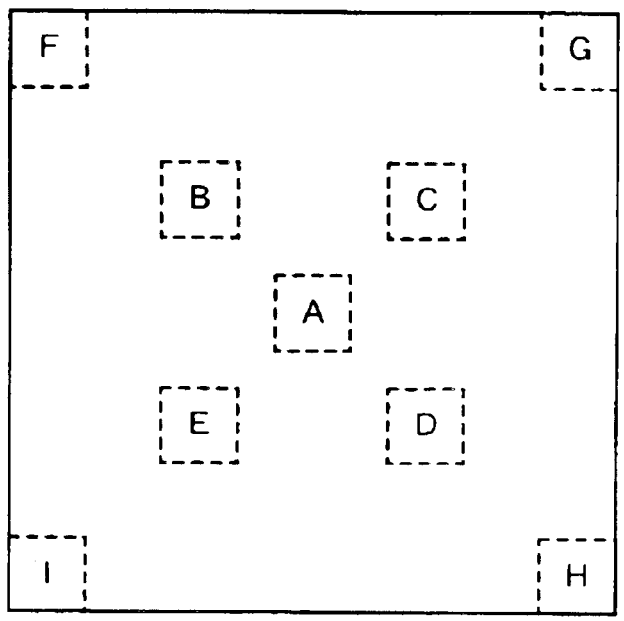
FIGS. 21A and 21B show measurement points of a substrate.
Figure 21B:
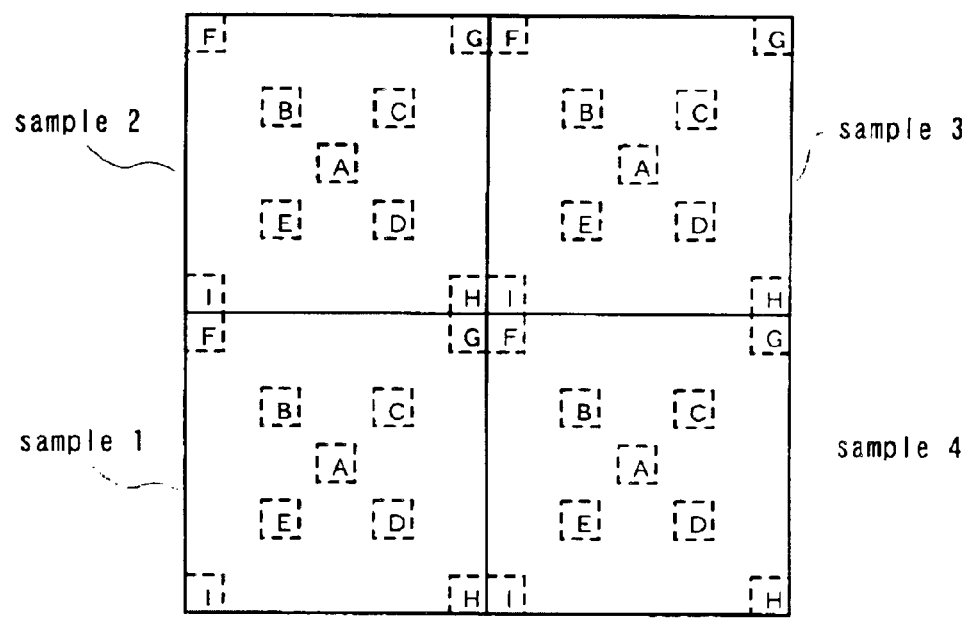

FIG. 20C is a display which comprises: a main body 3101; a supporting section 3102; and a display section 3103 etc. The present invention can be applied to the display section 3103. The display of the present invention is advantageous specifically when large sized, and it is advantageous in a display having a diagonal exceeding 10 inches (specifically exceeding 30 inches).

As described above, the applicable range of the present invention is very large, and the invention can be applied to electronic devices of various areas. Note that the electronic devices of the present embodiment can be achieved by utilizing any combination of constitutions in Embodiments 1 to 5.

According to the present invention, even if a substrate to be treated is enlarged, etching processing excellent in in-plane uniformity with high precision can be conducted without causing etching defects at corner portions of the substrate to be treated. Therefore, the dry etching apparatus of the present invention is suitable for large apparatuses to be mass-produced.

Furthermore, according to the present invention, in the case of etching a thin film to be treated or in the case of conducting etching processing with a low selection ratio, partial overetching that has been caused in the prior art can be suppressed, which is effective.

Furthermore, according to the present invention, even if a substrate to be treated is enlarged, the shape of semiconductor layers and that of contact holes can be made uniform over the entire surface of a substrate.

Furthermore, according to the present invention, in the case where a taper angle of a taper portion of the wiring is controlled by etching, a uniform taper angle can be obtained over the entire substrate.

What is claimed is:

1. An etching method using an ICP etching apparatus provided with an upper electrode and a lower electrode being opposed to said upper electrode, said lower electrode comprising at least first and second electrodes, said upper electrode comprising one coil electrode overlapping said first and second electrodes, the method comprising the steps of:

disposing a substrate on said first and second electrodes in a chamber;

supplying a reaction gas into said chamber under a reduce pressure;

applying a first high-frequency power to said coil electrode to generate plasma;

applying a second high-frequency power to said first electrode disposed below a central portion of said substrate and applying a third high-frequency power to said second electrode disposed below corner portions of said substrate to apply an AC electric field between said coil electrode and said first and second electrodes;

etching a material film on said substrate disposed on said first and second electrodes, wherein said second electrode is flush with said first electrode.

2. An etching method according to claim 1, wherein a frequency of each of said first, second, and third high-frequency power is the same.

3. An etching method using an ICP etching apparatus, the method comprising the steps of:

disposing a substrate on a plurality of electrodes provided in a chamber;

supplying a reaction gas into said chamber under a reduced pressure;

applying a first high-frequency power to a coil electrode to generate plasma, said coil electrode being opposed to said plurality of electrodes, and said coil electrode overlapping said plurality of electrodes;

applying a second high-frequency power to an electrode disposed below a central portion of said substrate and applying a third high-frequency power to electrodes disposed below corner portions of said substrate;

etching a material film on said substrate disposed on said plurality of electrodes, wherein said plurality of electrodes are flush with each other.

4. A method of forming a wiring, the method comprising the steps of:

forming a conductive film on a substrate;

selectively forming a mask on said conductive film;

disposing said substrate on at least first and second electrodes provided in a chamber provided with a third electrode opposed to said first and second electrodes, said coil electrode overlapping said first and second electrodes;

supplying a reaction gas into said chamber under a reduced pressure;

applying a first high-frequency power to said coil electrode to generate plasma;

applying a second high-frequency power to said first electrode disposed below a central portion of said substrate and applying a third high-frequency power to said second electrode disposed below corner portions of said substrate to apply an AC electric field between said coil electrode and said first and second electrodes;

selectively etching said conductive film on said substrate, wherein said first electrode is flush with said second electrode.

5. A method of forming a wiring according to claim 4, wherein said wiring is a gate electrode or a gate wiring of a TFT.

6. An etching method using an ICP etching apparatus, providing at least first, and second electrodes, and a coil electrode overlapping said first and second electrodes, the electrodes being independent from each other, said coil electrode being opposed to said first and second electrodes, and at least first, second, and third high-power sources independently connected to each of said first, second and coil electrodes, respectively, the method comprising the steps of:

disposing a substrate on said first and second electrodes provided in a chamber;

supplying a reaction gas into said chamber under a reduced pressure;

generating plasma by applying high-frequency power to said coil electrode by using said third high-power source; and etching a material film on said substrate disposed on said first and second electrodes, wherein said first and second electrodes are disposed so that an electric power applied to an entire surface of said substrate becomes uniform, wherein said second electrode is flush with said first electrode.

7. A method of manufacturing a semiconductor device using a dry etching apparatus, providing at least first, and second electrodes, and a coil electrode overlapping said first and second electrodes, the electrodes being independent from each other, said coil electrode being opposed to said first and second electrodes, the method comprising the steps of:

forming a material film on a substrate;

selectively forming a mask on said material film;

disposing said substrate on said first and second electrodes provided in a chamber;

supplying a reaction gas into said chamber under a reduced pressure;

applying a first high-frequency power to said coil electrode to generate plasma;

applying a second high-frequency power to said first electrode disposed below a central portion of said substrate and applying a third high-frequency power to said second electrode disposed below corner portions of said substrate;

etching a material film on said substrate disposed on said first and second electrodes; and dividing said substrate in order to obtain a plurality of second substrates, wherein said second electrode is flush with said first electrode.

8. A method of manufacturing a semiconductor device according to claim 7, wherein said semiconductor device is incorporated into an electronic device selected from the group consisting of a personal computer, a video camera, a mobile computer a goggle type display, a player, a digital camera, a front type projector, a rear type projector, a portable telephone a portable book, and a display.

9. An etching method comprising:

providing a radial line slot antenna supplying a microwave, at least first and second electrodes and at least first and second high-power sources independently connected to each of said first and second electrodes;

disposing a substrate on said first and second electrodes provided in a chamber;

supplying a reaction gas into said chamber under a reduced pressure;

generating plasma in a region between said radial slot antenna and said first and second electrodes by supplying the microwave from said radial slot antenna; and etching a material film on said substrate disposed on said first and second electrodes, wherein said first and second electrodes are disposed so that an electric power applied to an entire surface of said substrate becomes uniform, and wherein said first electrode is flush with said second electrode.

10. A method of manufacturing a semiconductor device comprising:

providing a radial line slot antenna supplying a microwave, at least first and second electrodes, forming a material film on a substrate;

selectively forming a mask on said material film;

disposing said substrate on said first and second electrodes provided in a chamber;

supplying a reaction gas into said chamber under a reduced pressure;

applying a first high-frequency power to said first electrode disposed below a central portion of said substrate and applying a second high-frequency power to said second electrode disposed below corner portions of said substrate;

generating plasma in a region between said radial slot antenna and said first and second electrodes by supplying the microwave from said radial slot antenna; and etching a material film on said substrate disposed on said first and second electrodes, wherein said first electrode is flush with said second electrode.

11. A method of manufacturing a semiconductor device according to claim 10, wherein said semiconductor device is incorporated into an electronic device selected from the group consisting of a personal computer, a video camera, a mobile computer a goggle type display, a player, a digital camera, a front type projector, a rear type projector, a portable telephone a portable book, and a display.

12. An etching method comprising:

providing at least first, second, third, fourth, fifth, and coil electrodes and at least first, second, third, fourth, fifth, and sixth high-power sources independently connected to each of said first, second, third, fourth, fifth, and coil electrodes, said coil electrode overlapping said first, second, third, fourth, and fifth electrodes;

disposing a substrate on said first, second, third, fourth and fifth electrodes provided in a chamber, wherein said first electrode is located below a central portion of said substrate and second, third, fourth and fifth electrodes are located below corner portions of said substrate;

supplying a reaction gas into said chamber under a reduced pressure;

generating plasma in a region between said first, second, third, fourth, and fifth electrodes and said coil electrode by applying a high-frequency power to said coil electrode using said sixth high-power source; and etching a material film on said substrate, wherein said first, second, third, fourth and fifth electrodes are disposed so that an electric power applied to an entire surface of said substrate becomes uniform, and wherein plasma is generated outside edge portions of said substrate, and wherein said first, second, third, fourth and fifth electrodes flush with each other.

13. A method of manufacturing a semiconductor device by using an ICP etching apparatus, the ICP etching apparatus comprising an upper electrode and a lower electrode being opposed to the upper electrode, the lower electrode comprising at least first and second electrodes, the upper electrode comprising one coil electrode overlapping the first and second electrodes, the method comprising:

forming a thin film transistor over a substrate;

forming an interlayer insulating film over the thin film transistor disposing the substrate over said first and second electrodes in a chamber;

supplying a reaction gas into said chamber under a reduced pressure;

applying a first high-frequency power to the coil electrode to generate plasma;

applying a second high-frequency power to the first electrode disposed below a central portion of the substrate and applying a third high-frequency power to the second electrode disposed below a corner portion of the substrate; and etching the interlayer insulating film in order to form a contact hole.

14. A method of manufacturing a semiconductor device by using an ICP etching apparatus, the ICP etching apparatus comprising an upper electrode and a lower electrode being opposed to the upper electrode, the lower electrode comprising at least first and second electrodes, the upper electrode comprising one coil electrode overlapping the first and second electrodes, the method comprising:

forming a semiconductor film over a substrate;

forming a conductive film over the semiconductor film;

forming a mask over the conductive film;

disposing the substrate over the first and second electrodes in a chamber;

supplying a reaction gas into said chamber under a reduced pressure;

applying a first high-frequency power to the coil electrode to generate plasma;

applying a second high-frequency power to the first electrode disposed below a central portion of the substrate and applying a third high-frequency power to the second electrode disposed below a corner portion of the substrate; and etching the conductive film in order to form a gate electrode.

\* \* \* \* \*